(12) United States Patent
Kim et al.

(10) Patent No.: US 12,132,070 B2
(45) Date of Patent: Oct. 29, 2024

(54) DISPLAY DEVICE

(71) Applicant: Samsung Display Co., LTD., Yongin-si (KR)

(72) Inventors: Jin Taek Kim, Yongin-si (KR); Ki Nyeng Kang, Sejong-si (KR); Jun Ho Bae, Asan-si (KR); Jong Hwan Cha, Suwon-si (KR); Min Cheol Chae, Asan-si (KR); Su Min Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 496 days.

(21) Appl. No.: 17/557,863

(22) Filed: Dec. 21, 2021

(65) Prior Publication Data

US 2022/0293671 A1    Sep. 15, 2022

(30) Foreign Application Priority Data

Mar. 10, 2021  (KR) .................. 10-2021-0031121

(51) Int. Cl.
| | |
|---|---|
| *H01L 33/38* | (2010.01) |
| *H01L 27/15* | (2006.01) |
| *H01L 33/08* | (2010.01) |
| *H01L 33/62* | (2010.01) |
| *H10K 59/121* | (2023.01) |
| *H10K 59/122* | (2023.01) |
| *H10K 59/123* | (2023.01) |
| *H10K 59/124* | (2023.01) |

(52) U.S. Cl.
CPC ............ *H01L 27/156* (2013.01); *H01L 33/08* (2013.01); *H01L 33/382* (2013.01); *H01L 33/62* (2013.01); *H10K 59/1213* (2023.02); *H10K 59/122* (2023.02); *H10K 59/123* (2023.02); *H01L 33/38* (2013.01); *H10K 59/124* (2023.02)

(58) Field of Classification Search
CPC ....... H01L 33/382; H01L 33/62; H01L 33/38; H01L 33/08; H10K 59/122; H10K 59/1213; H10K 59/123; H10K 59/124; H10K 59/1315; H05B 33/26; H05B 33/06
See application file for complete search history.

(56) References Cited

U.S. PATENT DOCUMENTS

2019/0206979 A1* 7/2019 Han ..................... H01L 27/12
2021/0134877 A1  5/2021 Kim et al.

* cited by examiner

*Primary Examiner* — David Vu
*Assistant Examiner* — Brandon C Fox
(74) *Attorney, Agent, or Firm* — Lewis Roca Rothgerber Christie LLP

(57) ABSTRACT

A display device includes conductive layers on a substrate, a via layer on the conductive layers, a first electrode and a second electrode extending in one direction on the via layer and spaced from each other, a first insulating layer on the first electrode and the second electrode, a plurality of light emitting elements on the first insulating layer, each of the light emitting elements having one end on the first electrode and an other end on the second electrode, and a first connection electrode and a second connection electrode on the first insulating layer, the first connection electrode overlapping the first electrode, and the second connection electrode overlapping the second electrode, wherein the first connection electrode and the second connection electrode are in contact with the conductive layers through contact portions.

22 Claims, 15 Drawing Sheets

DISPLAY DEVICE

CROSS-REFERENCE TO RELATED APPLICATION

This application claims priority to and the benefit of Korean Patent Application No. 10-2021-0031121 filed on Mar. 10, 2021 in the Korean Intellectual Property Office, the entire content of which is incorporated by reference herein.

BACKGROUND

1. Field

The present disclosure relates to a display device.

2. Description of the Related Art

The importance of display devices has steadily increased with the development of multimedia technology. In response thereto, various types of display devices such as an organic light emitting diode (OLED) display, a liquid crystal display (LCD) and the like have been used.

A display device is a device for displaying an image, and includes a display panel, such as a light emitting display panel or a liquid crystal display panel. The light emitting display panel may include light emitting elements, e.g., light emitting diodes (LEDs), and examples of the light emitting diode include an organic light emitting diode (OLED) using an organic material as a light emitting material and an inorganic light emitting diode using an inorganic material as a light emitting material.

SUMMARY

Aspects and features of embodiments of the present disclosure provide a display device capable of preventing or reducing luminance deterioration and generation of dark spots by decreasing contact resistance between an electrode and a wire.

However, aspects and features of embodiments of the present disclosure are not restricted to the ones set forth herein. The above and other aspects and features of embodiments of the present disclosure will become more apparent to one of ordinary skill in the art to which the present disclosure pertains by referencing the detailed description of the present disclosure given below.

In one or more embodiments, connection electrodes are directly connected to a third conductive layer to decrease the contact resistance between each of the connection electrodes and the third conductive layer, thereby preventing or reducing luminance deterioration and generation of dark spots.

In addition, a bridge layer is disposed between the third conductive layer and the connection electrodes or electrodes to decrease the contact resistance between each of the connection electrodes and the third conductive layer and the contact resistance between each of the electrodes and the third conductive layer, thereby preventing or reducing luminance deterioration and generation of dark spots.

However, the aspects and features of embodiments of the present disclosure are not limited to the aforementioned aspects and features, and various other aspects and features are included in the present specification.

According to one or more embodiments of the present disclosure, the display device includes conductive layers on a substrate, a via layer on the conductive layers, a first electrode and a second electrode extending in one direction on the via layer and spaced from each other, a first insulating layer on the first electrode and the second electrode, a plurality of light emitting elements on the first insulating layer, each of the light emitting elements having one end on the first electrode and an other end on the second electrode, and a first connection electrode and a second connection electrode on the first insulating layer, the first connection electrode overlapping the first electrode, and the second connection electrode overlapping the second electrode, wherein the first connection electrode and the second connection electrode are in contact with the conductive layers through contact portions.

In one or more embodiments, the conductive layers include a voltage wire and a conductive pattern connected to a transistor.

In one or more embodiments, the contact portions include a first contact portion exposing the conductive pattern and a second contact portion exposing the voltage wire, the first connection electrode is in contact with the conductive pattern through the first contact portion, and the second connection electrode is in contact with the voltage wire through the second contact portion.

In one or more embodiments, the first electrode includes a first opening overlapping the first connection electrode and the first contact portion, the second electrode includes a second opening overlapping the second connection electrode and the second contact portion, the first connection electrode is in contact with the conductive pattern through the first contact portion and the first opening, and the second connection electrode is in contact with the voltage wire through the second contact portion and the second opening.

In one or more embodiments, the first electrode is in contact with one region of the conductive pattern through the first contact portion, the first connection electrode is in contact with the first electrode and a remaining region of the conductive pattern through the first contact portion, the second electrode is in contact with one region of the voltage wire through the second contact portion, and the second connection electrode is in contact with the second electrode and a remaining region of the voltage wire through the second contact portion.

In one or more embodiments, the first connection electrode and the first electrode overlap each other on the one region of the conductive pattern, and the first connection electrode and the first electrode do not overlap on the remaining region of the conductive pattern.

In one or more embodiments, the contact portions further include a third contact portion that exposes the conductive pattern and is spaced from the first contact portion and a fourth contact portion that exposes the voltage wire and is spaced from the second contact portion, the first connection electrode is in contact with the conductive pattern through the first contact portion, the first electrode is in contact with the conductive pattern through the third contact portion, the second connection electrode is in contact with the voltage wire through the second contact portion, and the second electrode is in contact with the voltage wire through the fourth contact portion.

In one or more embodiments, the first connection electrode and the first electrode do not overlap in the first contact portion or the third contact portion, and the second connection electrode and the second electrode do not overlap in the second contact portion or the fourth contact portion.

In one or more embodiments, the conductive layers include a first layer, a second layer on the first layer, and a third layer on the second layer, and the first layer and the third layer include titanium and the second layer includes copper.

In one or more embodiments, the conductive layers further include a fourth layer on the third layer, and the fourth layer includes indium tin oxide or titanium.

In one or more embodiments, the display device further includes a bank partitioning an emission area of a sub-pixel of the display device and a sub-region of the sub-pixel that is spaced from the emission area in the one direction, wherein the plurality of light emitting elements are located in the emission area, wherein the contact portions are in the sub-region.

In one or more embodiments, the display device further includes a third electrode located on the via layer and facing the first electrode, and a third connection electrode located on the first insulating layer and overlapping the first electrode and the third electrode.

In one or more embodiments, the plurality of light emitting elements includes a first light emitting element on the first electrode and the third electrode, and a second light emitting element on the third electrode and the second electrode, wherein the first connection electrode is in contact with one end of the first light emitting element, and a portion of the third connection electrode is in contact with an other end of the first light emitting element, and wherein the second connection electrode is in contact with one end of the second light emitting element, and another portion of the third connection electrode is in contact with an other end of the second light emitting element.

In one or more embodiments, the plurality of light emitting elements includes a first semiconductor layer, a light emitting layer on the first semiconductor layer, a second semiconductor layer on the light emitting layer, an electrode layer on the second semiconductor layer, and an insulating film that is around the first semiconductor layer, the light emitting layer, the second semiconductor layer, and the electrode layer.

According to one or more embodiments of the present disclosure, the display device includes conductive layers on a substrate, a via layer on the conductive layers, bridge layers on the via layer and the conductive layers and in contact with the conductive layers, a first electrode and a second electrode extending in one direction on the via layer and the bridge layers, the first electrode and the second electrode being spaced from each other, a first insulating layer on the first electrode and the second electrode, a plurality of light emitting elements on the first insulating layer, each of the light emitting elements having one end on the first electrode and an other end on the second electrode, and a first connection electrode and a second connection electrode on the first insulating layer, the first connection electrode overlapping the first electrode, and the second connection electrode overlapping the second electrode, wherein the first electrode is in contact with one of the bridge layers through a first electrode contact hole, and the first connection electrode is in contact with the other one of the bridge layers through a first contact portion.

In one or more embodiments, the conductive layers include a voltage wire and a conductive pattern connected to a transistor, the bridge layers include a first bridge layer that does not overlap the first connection electrode and a second bridge layer that overlaps the first connection electrode, and the voltage wire is in contact with the first bridge layer and the conductive pattern is in contact with the second bridge layer.

In one or more embodiments, the first electrode is in contact with the first bridge layer to be connected to the voltage wire, and the first connection electrode is in contact with the second bridge layer to be connected to the conductive pattern.

In one or more embodiments, the display device further includes a passivation layer between the conductive layers and the via layer, wherein the first electrode contact hole penetrates the via layer and the passivation layer to expose the voltage wire, and the first contact portion penetrates the via layer and the passivation layer to expose the conductive pattern.

In one or more embodiments, the display device further includes a bank partitioning an emission area of a sub-pixel of the display device and a sub-region of the sub-pixel that is spaced from the emission area in the one direction, wherein the plurality of light emitting elements are located at the emission area, wherein the first bridge layer does not overlap the bank and at least a portion of the second bridge layer overlaps the bank.

In one or more embodiments, the first electrode includes a first opening overlapping the first connection electrode and the first contact portion, and the first connection electrode is in contact with the second bridge layer through the first contact portion and the first opening.

In one or more embodiments, the first electrode is connected to the first connection electrode and the conductive pattern through the second bridge layer.

In one or more embodiment, the display device further includes a bank partitioning an emission area of a sub-pixel of the display device and a sub-region of the sub-pixel that is spaced from the emission area in the one direction, wherein the plurality of light emitting elements are located at the emission area, wherein the first electrode contact hole and the first contact portion are in the sub-region.

BRIEF DESCRIPTION OF THE DRAWINGS

The above and other aspects and features of embodiments of the present disclosure will become more apparent by describing in detail embodiments thereof with reference to the attached drawings, in which.

DETAILED DESCRIPTION

The embodiments of the present disclosure will now be described more fully hereinafter with reference to the accompanying drawings, in which embodiments of the present disclosure are shown. The embodiments of the present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments will be described in detail with reference to the accompanying drawings.

Figure 1:
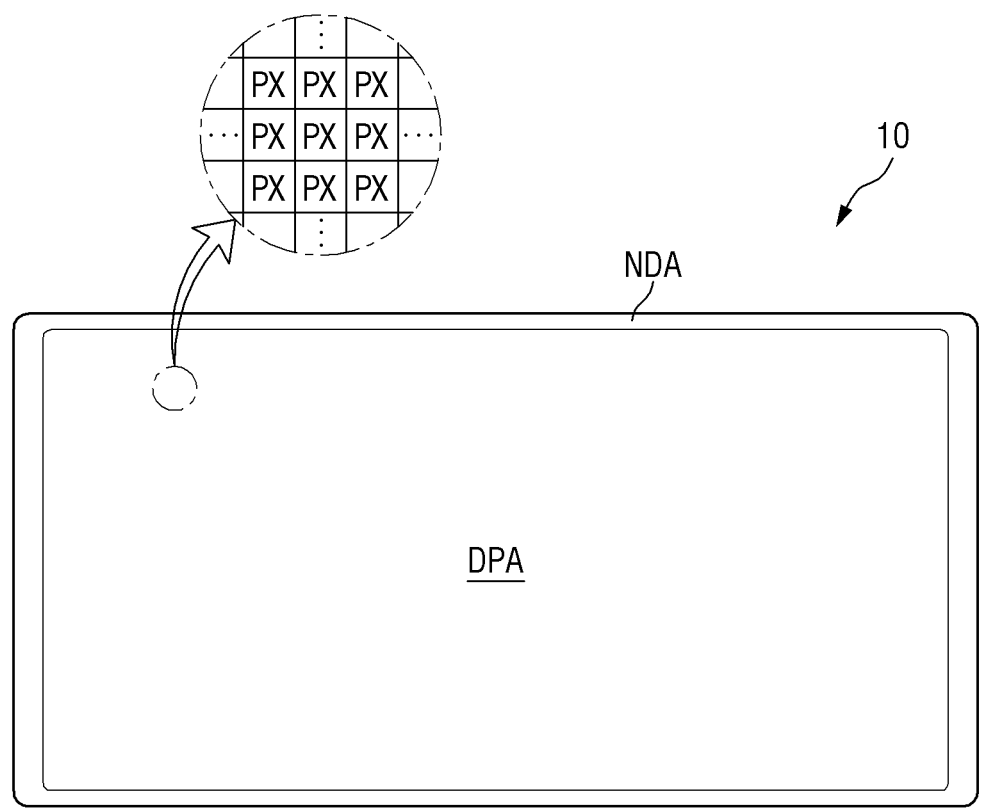
FIG. 1 is a schematic plan view of a display device according to one or more embodiments.
Figure 1:
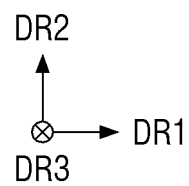

FIG. 1 is a schematic plan view of a display device according to one or more embodiments.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel that provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be exemplified, but the present disclosure is not limited thereto, and other display panels may be applied within the same scope of the technical spirit.

A first direction DR1, a second direction DR2, a third direction DR3 are defined in the drawing illustrating the display device 10. The first direction DR1 and the second direction DR2 may be directions perpendicular to each other in one plane. The third direction DR3 may be a direction perpendicular to a plane on which the first direction DR1 and the second direction DR2 are located. The third direction DR3 is perpendicular to each of the first direction DR1 and the second direction DR2. In embodiments describing the display device 10, the third direction DR3 indicates a thickness direction of the display device 10.

The shape of the display device 10 may be variously modified. For example, the display device 10 may have a rectangular shape including long and short sides such that the side in the first direction DR1 is longer than the side in the second direction DR2 in a plan view. For another example, the display device 10 may have a rectangular shape including long and short sides such that the side in the second direction DR2 is longer than the side in the first direction DR1 in a plan view. However, the present disclosure is not limited thereto, and the planar shape of the display device 10 may be a square shape, a quadrilateral shape with rounded corners (e.g., vertices), other polygonal shapes and a circular shape, or the like. The shape of a display area DPA of the display device 10 may also be similar to the overall shape of the display device 10. FIG. 1 illustrates the display device 10 and the display area DPA having a rectangular shape in which the side in the first direction DR1 is longer than the side in the second direction DR2.

The display device 10 may include the display area DPA and a non-display area NDA around the edge or periphery of the display area DPA. The display area DPA is an area where an image can be displayed, and the non-display area NDA is an area where an image is not displayed. The display area DPA may also be referred to as an active region, and the non-display area NDA may also be referred to as a non-active region. The display area DPA may substantially occupy the center (or central region) of the display device 10.

The display area DPA may include a plurality of pixels PX. The plurality of pixels PX may be arranged in a matrix. The shape of each pixel PX may be a rectangular or square shape in a plan view. However, the present disclosure is not limited thereto, and it may be a rhombic shape in which each side is inclined with respect to one direction. The pixels PX may be alternately disposed in a stripe arrangement structure or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In addition, each of the pixels PX may include one or more light emitting elements that emit light of a specific wavelength band to display a specific color.

The non-display area NDA may be disposed around the display area DPA. The non-display area NDA may be completely or partially around (e.g., surround) the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
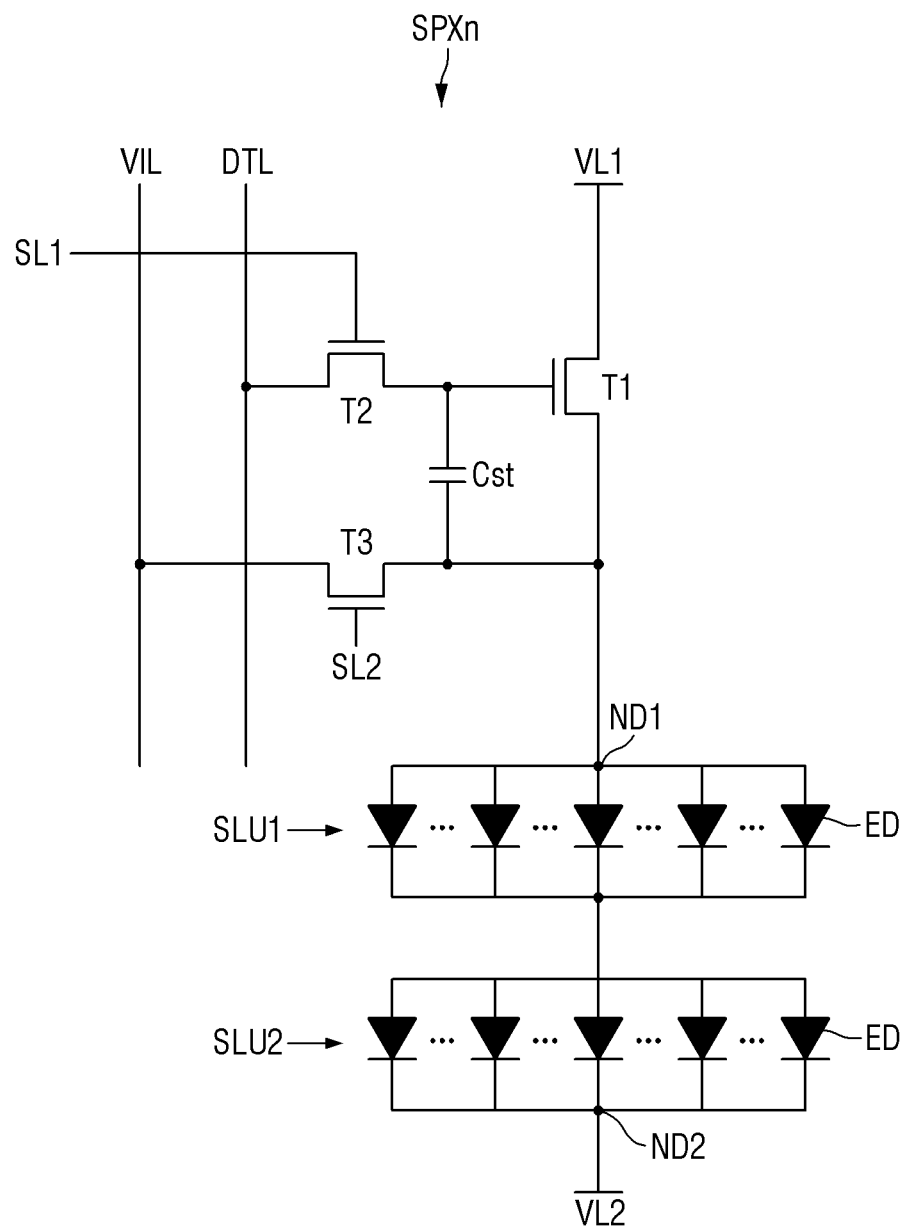
FIG. 2 is an equivalent circuit diagram of a sub-pixel of a display device according to one or more embodiments.

FIG. 2 is an equivalent circuit diagram of a sub-pixel of a display device according to one or more embodiments.

Referring to FIG. 2, each sub-pixel SPXn of the display device 10 according to one or more embodiments may include three transistors T1, T2, and T3 and one storage capacitor Cst in addition to at least one light emitting element ED.

The light emitting element ED emits light according to a current supplied through the first transistor T1. The light emitting element ED may emit light in a specific wavelength range by electric signals received from a first electrode and a second electrode that are connected to both ends thereof.

At least one light emitting element ED may include a first electrode, a second electrode, and a plurality of light emitting groups that are disposed therebetween and connected in series. In one or more embodiments, at least one light emitting element ED may include two light emitting groups connected in series, that is, a first light emitting group SLU1 and a second light emitting group SLU2. The drawing illustrates a structure in which the light emitting groups are connected in series in two stages, but the present disclosure is not limited thereto. The light emitting groups may be connected in series in three stages, four stages, or five or more stages.

One end of the first light emitting group SLU1 may be connected to a first electrode, which is connected to a first node ND1, and the other end of the first light emitting group SLU1 may be connected to one end of the second light emitting group SLU2. One end of the second light emitting group SLU2 may be connected to the other end of the first light emitting group SLU1, and the other end of the second light emitting group SLU2 may be connected to a second electrode that is connected to a second node ND2.

One or more light emitting elements ED included in each light emitting group SLU1, SLU2 may be connected in parallel or in series to each other in a forward direction between the first electrode and the second electrode. For example, the light emitting elements ED included in each of the light emitting groups SLU1 and SLU2 may be connected in parallel in each of the light emitting groups SLU1 and SLU2, and the light emitting elements ED included in different light emitting groups SLU1 and SLU2 may be connected in series.

One end of the light emitting element ED included in the first light emitting group SLU1 may be connected to a first voltage wire VL1 via the first electrode and the source electrode of the first transistor T1. Further, the other end of the light emitting element ED included in the second light emitting group SLU2 may be connected to a second voltage wire VL2, to which a low potential voltage (hereinafter, referred to as a second power voltage) that is lower than a high potential voltage (hereinafter, referred to as a first power voltage) of the first voltage wire VL1 is supplied, via the second electrode. Accordingly, one or more light emitting elements ED may be aligned in the forward direction between the first voltage wire VL1 and the second voltage wire VL2. A current flows into one or more light emitting elements ED that are included in each light emitting group SLU1, SLU2 and are connected in series, so that the light emitting elements ED may emit light.

The first transistor T1 adjusts a current flowing from the first voltage wire VL1, to which the first power voltage is supplied, to the light emitting element ED according to the voltage difference between the gate electrode and the source electrode of the first transistor T1. For example, the first transistor T1 may be a driving transistor for driving the light emitting element ED. The gate electrode of the first transistor T1 may be connected to the source electrode of the second transistor T2, the source electrode of the first transistor T1 may be connected to one end of the light emitting element ED, and the drain electrode of the first transistor T1 may be connected to the first voltage wire VL1 to which the first power voltage is applied.

The second transistor T2 is turned on by a scan signal of a first scan line SL1 to connect the data line DTL to the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

The third transistor T3 is turned on by a scan signal of a second scan line SL2 to connect the initialization voltage wire VIL to one end of the light emitting element ED. The gate electrode of the third transistor T3 may be connected to the second scan line SL2, the drain electrode thereof may be connected to the initialization voltage wire VIL, and the source electrode thereof may be connected to one end of the light emitting element ED or to the source electrode of the first transistor T1. The drawing illustrates the first scan line SL1 and the second scan line SL2 separately, but the present disclosure is not limited thereto. In one or more embodiments, the first scan line SL1 and the second scan line SL2 may be made of one wire. In this case, the second transistor T2 and the third transistor T3 may be concurrently turned on (e.g., simultaneously turned on) by an identical scan signal.

In one embodiment, the source electrode and the drain electrode of each of the transistors T1, T2, and T3 are not limited to those described above, and vice versa. Further, each of the transistors T1, T2, and T3 may be formed of a thin film transistor. In addition, in FIG. 2, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. Alternatively, one or more of the transistors T1, T2, and T3 may be formed of an N-type MOSFET and the others may be formed of a P-type MOSFET.

The storage capacitor Cst is formed between the gate electrode and the source electrode of the first transistor T1. The storage capacitor Cst stores a difference voltage between a gate voltage and a source voltage of the first transistor T1.

Hereinafter, a structure of one pixel PX of the display device 10 according to one embodiment will be described in detail additionally with reference to other drawings.

Figure 3:
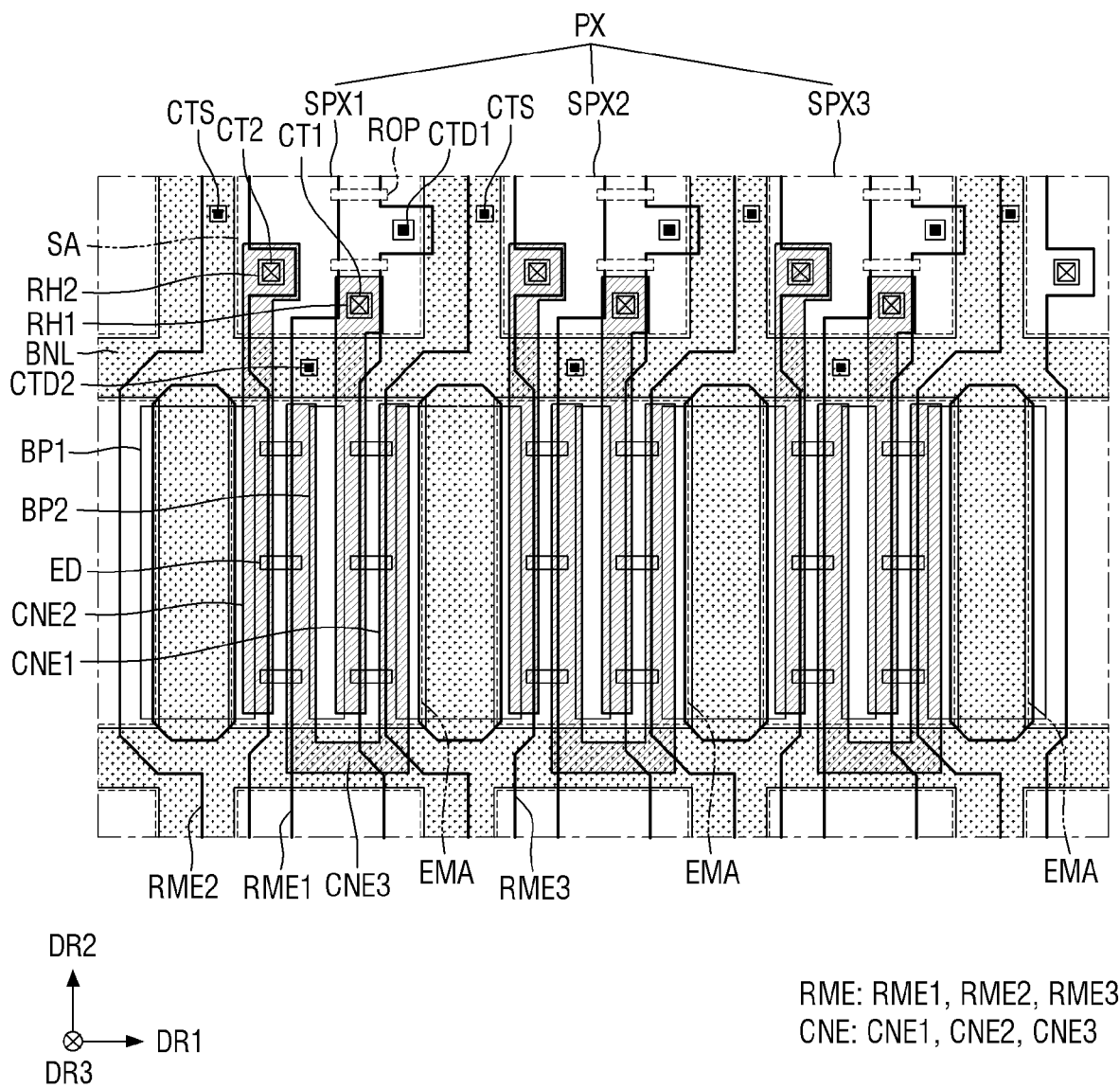
FIG. 3 is a plan view illustrating one pixel of a display device according to one or more embodiments.

FIG. 3 is a plan view illustrating one pixel of a display device according to one embodiment.

Referring to FIG. 3, each of the plurality of pixels PX of the display device 10 may include a plurality of sub-pixels SPXn (n ranging from 1 to 3). For example, one pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the present disclosure is not limited thereto, and the sub-pixels SPXn may emit light of the same color. In one embodiment, each of the sub-pixels SPXn may emit blue light. In addition, although FIG. 3 illustrates that one pixel PX includes three sub-pixels SPXn, the present disclosure is not limited thereto, and the pixel PX may include a larger number of sub-pixels SPXn.

Each sub-pixel SPXn of the display device 10 may include an emission area EMA and a non-emission area. The emission area EMA may be an area where the light emitting elements ED are aligned to emit light of a certain wavelength band. The non-emission area may be an area where there is no light emitting element ED and the light emitted from the light emitting elements ED does not reach, so that no light is emitted. The emission area EMA may include an area in which the light emitting elements ED are disposed, and an area adjacent to the light emitting elements ED to emit light emitted from the light emitting elements ED.

Without being limited thereto, the emission area EMA may also include an area in which light emitted from the light emitting elements ED is reflected or refracted by another member and emitted. The plurality of light emitting elements ED may be disposed in the respective sub-pixels SPXn, and the emission area EMA may be formed to include an area where the light emitting elements 30 are disposed and an area adjacent thereto.

Although it is shown in the drawing that the sub-pixels SPXn have the emission areas EMA that are substantially identical in size, the present disclosure is not limited thereto. In one or more embodiments, the emission areas EMA of the sub-pixels SPXn may have different sizes according to a color or wavelength band of light emitted from the light emitting element ED disposed in each sub-pixel.

In addition, each sub-pixel SPXn may further include a sub-region SA disposed in the non-emission area. The sub-region SA may be disposed in the second direction DR2 from the emission area EMA to be disposed between the emission areas EMA of the sub-pixels SPXn that are adjacent to each other in the second direction DR2. For example, the emission areas EMA and the sub-regions SA may respectively be repeatedly arranged along the second direction DR2, and the emission areas EMA and the sub-regions SA may be alternately arranged. However, the present disclosure is not limited thereto, and the arrangement of the emission areas EMA and the sub-regions SA in the plurality of pixels PX may be different from that shown in FIG. 3. In one pixel PX illustrated in FIG. 3, the emission area EMA and the sub-region SA, which is disposed above the emission area EMA in the second direction DR2, may be included in one sub-pixel SPXn. A portion disposed in a direction opposite to the second direction DR2 from the emission area EMA may be the sub-region SA of another sub-pixel SPXn.

A bank BNL may be disposed between the sub-regions SA and between the emission areas EMA, and the distance therebetween may vary with the width of the bank BNL. Light may not be emitted from the sub-region SA because the light emitting element ED is not disposed in the sub-region SA, but electrodes RME1, RME2, and RME3 disposed in each sub-pixel SPXn may be partially disposed in the sub-region SA. The electrodes RME disposed in different sub-pixels SPXn may be partially disposed to be separated at a separation portion ROP of the sub-region SA.

The bank BNL may include portions extending in the first direction DR1 and the second direction DR2 in a plan view to be arranged in a grid pattern over the entire surface of the display area DPA. The bank BNL may be disposed along the boundaries between the sub-pixels SPXn to delimit the neighboring sub-pixels SPXn. Further, the bank BNL may be disposed so as to be around (e.g., surround) the emission area EMA disposed for each sub-pixel SPXn to distinguish the emission areas EMA.

Each pixel PX or sub-pixel SPXn of the display device 10 includes a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to one or more embodiments, in each sub-pixel SPXn of the display device 10, the pixel driving circuit may have a 3T1C structure including three transistors and one capacitor, as described above with reference to FIG. 2. However, the present disclosure is not limited thereto, and various other modified structures of the pixel PX such as a 2T1C structure, a 7T1C structure, and a 6T1C structure may be applied.

Figure 4:
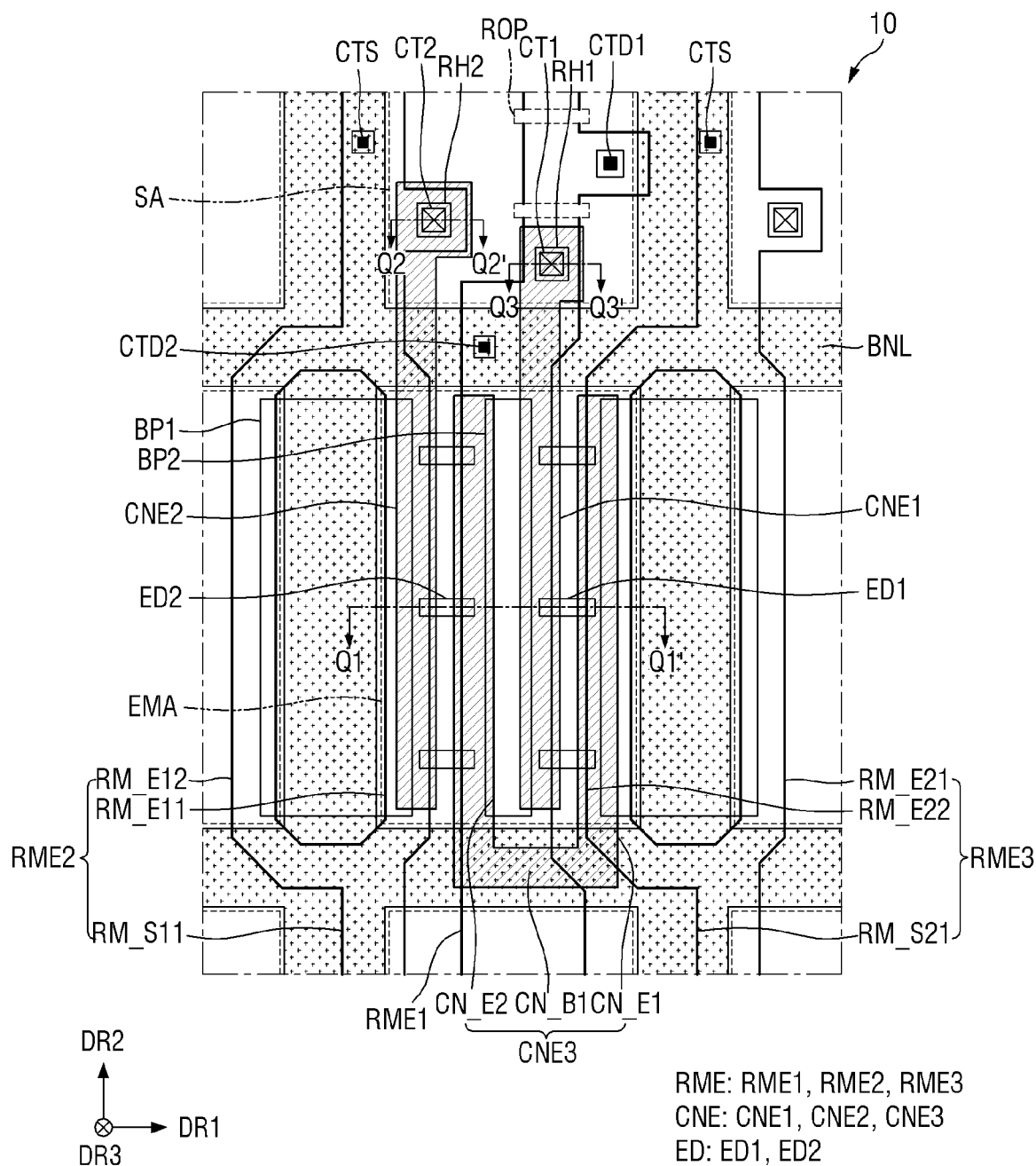
FIG. 4 is a plan view illustrating a first sub-pixel of FIG. 3.
Figure 5:
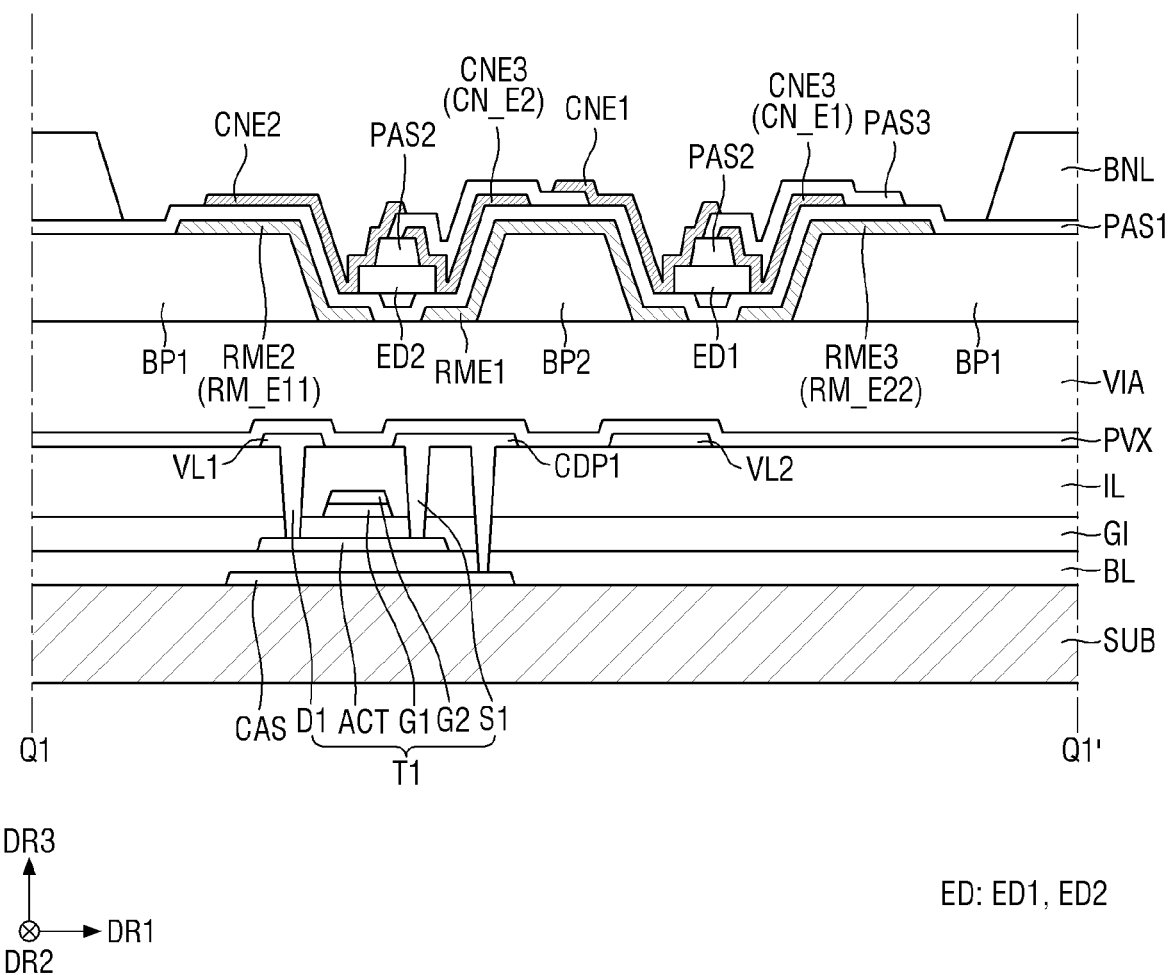
FIG. 5 is a cross-sectional view taken along the line Q1-Q1' of FIG. 4.
Figure 6:
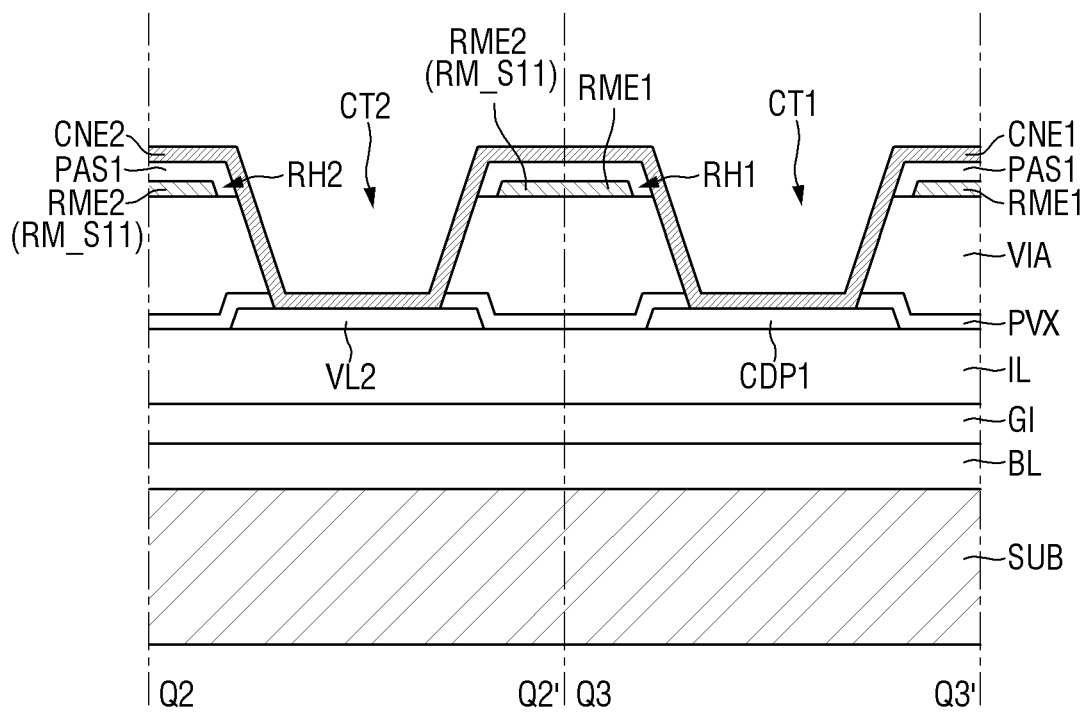
FIG. 6 is a cross-sectional view taken along the lines Q2-Q2' and Q3-Q3' of FIG. 4.
Figure 7:
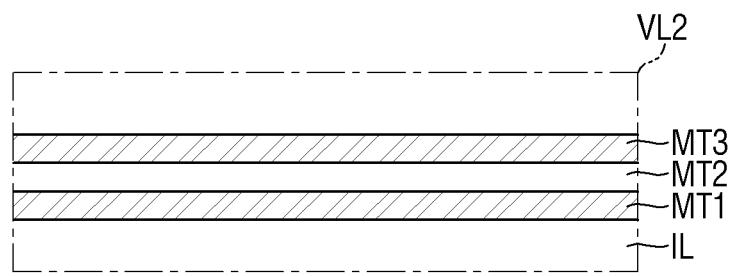
FIG. 7 is a cross-sectional view illustrating a third conductive layer according to one or more embodiments.
Figure 8:
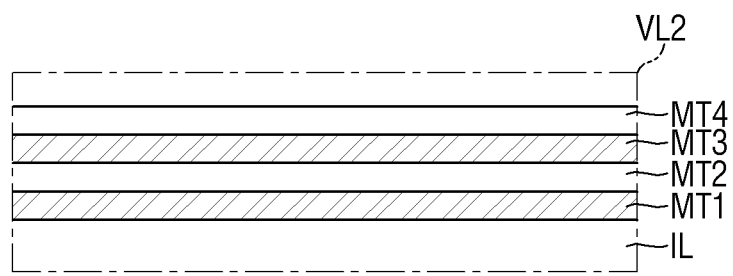
FIG. 8 is a cross-sectional view of a third conductive layer according to one or more embodiments.

FIG. 4 is a plan view illustrating a first sub-pixel of FIG. 3. FIG. 5 is a cross-sectional view taken along the line Q1-Q1' of FIG. 4. FIG. 6 is a cross-sectional view taken along the lines Q2-Q2' and Q3-Q3' of FIG. 4. FIG. 7 is a cross-sectional view illustrating a third conductive layer according to one or more embodiments. FIG. 8 is a cross-sectional view of a third conductive layer according to one or more embodiments. Hereinafter, configurations overlapping with the configurations described above by referring to FIG. 3 will be briefly described.

Referring to FIGS. 4-8 in conjunction with FIG. 3, the display device 10 may include a substrate SUB and a semiconductor layer, a plurality of conductive layers, and a plurality of insulating layers arranged on the substrate SUB. The semiconductor layer, the conductive layers, and the insulating layers may each constitute a transistor layer and a light emitting element layer of the display device 10.

For example, the substrate SUB may be an insulating substrate. The substrate SUB may be made of an insulating material such as glass, quartz, or polymer resin. Further, the substrate SUB may be a rigid substrate, but may also be a flexible substrate that can be bent, folded, and/or rolled.

A first conductive layer may be disposed on the substrate SUB. The first conductive layer includes a lower metal layer CAS that may be disposed to overlap an active layer ACT of a first transistor T1 in the third direction DR3. The lower metal layer CAS may include a material for blocking light to prevent light from reaching the active layer ACT of the first transistor T1. In one embodiment, an insulating film may be further included between the substrate SUB and the lower metal layer CAS.

The buffer layer BL may be disposed on the lower metal layer CAS and the substrate SUB. The buffer layer BL may be formed on the substrate SUB to protect the transistors from moisture permeating through the substrate SUB susceptible to moisture permeation, and may perform a surface planarization function.

The semiconductor layer may be disposed on the buffer layer BL. The semiconductor layer may include the active layer ACT of the first transistor T1. The active layer ACT may be arranged to partially overlap a gate electrode G1 of a second conductive layer, to be described later, in the third direction DR3.

The semiconductor layer may include polycrystalline silicon, monocrystalline silicon, oxide semiconductor, and the like. In one or more embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that one first transistor T1 is disposed in the sub-pixel SPXn of the display device 10, but the present disclosure is not limited thereto, and the display device 10 may include a larger number of transistors.

The gate insulating layer GI may be disposed on the active layer ACT and the buffer layer BL. The gate insulating layer GI may serve as a gate insulating film of the first transistor T1.

The second conductive layer may be disposed on the gate insulating layer GI. The second conductive layer may include the gate electrode G1 of the first transistor T1. The gate electrode G1 may be arranged to overlap the channel region of the active layer ACT of the first transistor T1 in the third direction DR3, which is the thickness direction.

An interlayer insulating layer IL may be disposed on the second conductive layer and the gate insulating layer GI. The interlayer insulating layer IL may function as an insulating film between the second conductive layer and other layers disposed thereon, and may protect the second conductive layer.

The third conductive layer may be disposed on the interlayer insulating layer IL. The third conductive layer may include the first voltage wire VL1, the second voltage wire VL2, and a conductive pattern CDP1.

The first voltage wire VL1 may be applied with a high potential voltage (or a first power voltage) transmitted to the first electrode RME1, and the second voltage wire VL2 may be applied with a low potential voltage (or a second power voltage) transmitted to the second electrode RME2. A portion of the first voltage wire VL1 may be in contact with the active layer ACT of the first transistor T1 through the contact hole penetrating the interlayer insulating layer IL and the gate insulating layer GI. The first voltage wire VL1 may serve as a first drain electrode D1 of the first transistor T1. The second voltage wire VL2 may be directly connected to the second electrode RME2 to be described later. Further, the first voltage wire VL1 may be connected to a first connection electrode CNE1, which will be described later, via the first transistor T1. The second voltage wire VL2 may be directly connected to a second connection electrode CNE2 which will be described later.

A first conductive pattern CDP1 may be in contact with the active layer ACT of the first transistor T1 through the contact hole penetrating the interlayer insulating layer IL and the gate insulating layer GI. Further, the first conductive pattern CDP1 may be in contact with the lower metal layer CAS through another contact hole penetrating the interlayer insulating layer IL, the gate insulating layer GI, and the buffer layer BL. The first conductive pattern CDP1 may serve as a first source electrode S1 of the first transistor T1.

The buffer layer BL, the gate insulating layer GI, and the interlayer insulating layer IL described above may be formed of a plurality of inorganic layers stacked in an alternating manner. For example, the buffer layer BL, the gate insulating layer GI, and the interlayer insulating layer IL may be formed as a double layer formed by stacking, or a multilayer formed by alternately stacking, inorganic layers including at least one of silicon oxide (SiOx), silicon nitride (SiNx), or silicon oxynitride (SiOxNy). However, the present disclosure is not limited thereto, and the buffer layer BL, the gate insulating layer GI, and the interlayer insulating layer IL may be formed as a single inorganic layer containing the above-described insulating material. Further, in one or more embodiments, the interlayer insulating layer IL may be made of an organic insulating material such as polyimide (PI) or the like.

The second conductive layer and the third conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the present disclosure is not limited thereto.

A passivation layer PVX may be disposed on the third conductive layer. The passivation layer PVX may be formed of at least one inorganic layer to protect underlying layers.

A via layer VIA may be disposed on the passivation layer PVX. The via layer VIA may include an organic insulating material, for example, an organic insulating material such as polyimide (PI), to perform a surface planarization function.

As a display element layer, a plurality of electrodes RME (RME1, RME2, and RME3), a plurality of first bank patterns BP1, a second bank pattern BP2, a plurality of light emitting elements ED, and a plurality of connection electrodes CNE1, CNE2, and CNE3 may be disposed on the via layer VIA. Further, a plurality of insulating layers PAS1, PAS2, and PAS3 may be disposed on the via layer VIA.

The plurality of first bank patterns BP1 and the second bank pattern BP2 may be directly disposed on the via layer VIA. The first bank patterns BP1 may be disposed over the emission area EMA and the non-emission area of the sub-pixel SPXn. The first bank patterns BP1 may be disposed over the sub-pixels SPXn that are adjacent in the second direction DR2. The first bank patterns BP1 may have a shape extending in the second direction DR2 and may be spaced from each other in the first direction DR1. The first bank patterns BP1 may have the same width, but are not limited thereto. The first bank patterns BP1 may have different widths. The length of the first bank patterns BP1 extending in the second direction DR2 may be smaller than the length of the emission area EMA surrounded by the bank BNL in the second direction DR2.

The second bank pattern BP2 may be disposed in the emission area EMA of the sub-pixel SPXn and may have a shape extending in the second direction DR2. The second bank pattern BP2 may be disposed between the first bank patterns BP1 while being spaced from the first bank patterns BP1 in the first direction DR1. The second bank pattern BP2 may form an island-like pattern, which has a narrow width and extends in the second direction DR2 in the emission area EMA of each sub-pixel SPXn, over the entire surface of the display area DPA.

The second bank pattern BP2 is disposed in the center (or a central region) of the emission areas EMA, and the first bank patterns BP1 are disposed to be spaced from the second bank pattern BP2 that is interposed therebetween. The first bank pattern BP1 and the second bank pattern BP2 may be alternately disposed along the second direction DR2. The light emitting elements ED may be disposed between the first bank pattern BP1 and the second bank pattern BP2 that are spaced from each other in the first direction DR1.

The first bank pattern BP1 and the second bank pattern BP2 may have the same length in the second direction DR2, but may have different widths measured in the first direction DR1. In the bank BNL, a portion extending in the second direction DR2 may overlap the first bank pattern BP1 in the thickness direction or the third direction DR3. The bank patterns BP1 and BP2 may be disposed in an island-like pattern on the entire surface of the display area DPA. The plurality of light emitting elements ED may be disposed between the bank patterns BP1 and BP2 that are spaced from each other.

The bank patterns BP1 and BP2 may have a structure in which at least a portion thereof protrudes from the top surface of the via layer VIA. The protruding portion of the bank patterns BP1 and BP2 may have an inclined or curved side surface. Unlike the illustrated example in the drawings, each of the bank patterns BP1 and BP2 may have a shape of a semi-circle or semi-ellipse whose outer surface is curved in cross-sectional view. The bank patterns BP1 and BP2 may include an organic insulating material such as polyimide (PI), but is not limited thereto.

The plurality of electrodes RME have a shape extending in one direction and may be disposed for each sub-pixel SPXn. The plurality of electrodes RME may extend in the second direction DR2 to be disposed across the emission area EMA of the sub-pixel SPXn and the sub-region SA, and may be disposed to be spaced from each other in the first direction DR1. The display device 10 includes the first electrode RME1, the second electrode RME2, and the third electrode RME3 disposed in each sub-pixel SPXn. The first electrode RME1 may be disposed at the center of the emission area EMA. The second electrode RME2 may be spaced from the first electrode RME1 in the first direction DR1 to be disposed at the left side of the center of the emission area EMA. The third electrode RME3 may be spaced from the first electrode RME1 in the first direction DR1 to be disposed at the right side of the center of the emission area EMA.

The first electrode RME1 may be arranged on the second bank pattern BP2 disposed at the center of the emission area EMA. The second electrode RME2 may be partially arranged on the first bank pattern BP1 disposed at the left side of the emission area EMA. The third electrode RME3 may be partially arranged on the first bank pattern BP1 disposed at the right side of the emission area EMA. The plurality of electrodes RME may be disposed on at least the inclined side surfaces of the bank patterns BP1 and BP2. In one embodiment, the first electrode RME1 may have a larger width in the first direction DR1 than the second bank pattern BP2, and the second electrode RME2 and the third electrode RME3 may have a smaller width in the first direction DR1 than the first bank pattern BP1. Each of the electrodes RME may have at least a portion directly disposed on the via layer VIA, so that they may be disposed at the same plane.

In one or more embodiments, one first electrode RME1 may be disposed in each sub-pixel SPXn, and each of the second and third electrodes RME2 and RME3 may be disposed over the different sub-pixels SPXn that are adjacent to each other in the first direction DR1. The second electrode RME2 may include a first extension RM_S11, and a first-first branch RM_E11 and a first-second branch RM_E12 that are branched from the first extension RM_S11 in both directions. The first-first branch RM_E11 branched from the first extension RM_S11 is adjacent to the first electrode RME1 while facing (or being opposite to) the first electrode RME1, and the first-second branch RM_E12 branched from the first extension RM_S11 is arranged in another sub-pixel SPXn that is spaced in the first direction DR1. The first-first branch RM_E11 and the first-second branch RM_E12 of the second electrode RME2 are branched in the emission area EMA, and join into the first extension RM_S11 again in the sub-region SA.

The third electrode RME3 may include a second extension RM_S21, and a second-first branch RM_E21 and a second-second branch RM_E22 that are branched from the second extension RM_S21 in both directions. The second-first branch RM_E21 branched from the second extension RM_S21 is disposed in another sub-pixel SPXn that is spaced in the first direction DR1, and the second-second branch RM_E22 branched from the second extension RM_S21 is adjacent to the first electrode RME1 while facing (or being opposite to) the first electrode RME1. The second-first branch RM_E21 and the second-second branch RM_E22 of the third electrode RME3 are branched in the emission area EMA, and join into the second extension RM_S21 again in the sub-region SA.

The first electrode RME1, the first-first branch RM_E11 of the second electrode RME2, and the second-second branch RM_E22 of the third electrode RME3 may be disposed in the emission area EMA of the first sub-pixel SPX1. For simplicity of description, the second electrode RME2 and the third electrode RME3 are named differently and described, but the second electrode RME2 and the third electrode RME3 are substantially one electrode. For example, when viewed from another sub-pixel SPXn that is spaced in the first direction DR1, the third electrode RME3 may be the second electrode RME2.

The first to third electrodes RME1, RME2, and RME3 may be connected to the third conductive layer through first electrode contact holes CTD1 and CTD2, and a second electrode contact hole CTS, respectively.

In one embodiment, the first electrode contact holes CTD1 and CTD2 may include a first-first electrode contact hole CTD1 arranged in the sub-region SA that does not overlap the bank BNL in the third direction DR3 and a first-second electrode contact hole CTD2 arranged to overlap the bank BNL in the third direction DR3. In one or more embodiments, the first electrode RME1 may be connected to the first voltage wire VL1 through the first-first electrode contact hole CTD1 that penetrates the via layer VIA and the passivation layer PVX under the first electrode RME1. Accordingly, a signal for aligning the light emitting elements ED may be applied to the first electrode RME1 through the first voltage wire VL1. In addition, the first electrode RME1 may be connected to the first conductive pattern CDP1 through the first-second electrode contact hole CTD2 that penetrates the via layer VIA and the passivation layer PVX under the first electrode RME1. Therefore, the first power voltage transmitted through the first transistor T1 may be applied to the first electrode RME1 through the first conductive pattern CDP1. As will be described later, the first electrode RME1 may be separated at the separation portion ROP after the alignment of the light emitting element ED, so that the first electrode RME1 may not receive the signal directly from the first voltage wire VL1. The first electrode RME1 that has been separated at the separation portion ROP may be connected to the first conductive pattern CDP1 through the first-second electrode contact hole CTD2. Thus, the first power voltage transmitted through the first transistor T1 may be applied to the first electrode RME1 through the first conductive pattern CDP1.

The second and third electrodes RME2 and RME3 may be in contact with the second voltage wire VL2 through the second electrode contact hole CTS that penetrates the via layer VIA and the passivation layer PVX under the second and third electrodes RME2 and RME3. The first electrode RME1 may be electrically connected to the first transistor T1 through the first conductive pattern CDP1 and may receive the first power voltage. The second and third electrodes RME2 and RME3 may be electrically connected to the second voltage wire VL2 and may receive the second power voltage.

The first electrodes RME1 disposed in different sub-pixels SPXn, which are adjacent in the second direction DR2 or in the opposite direction to the second direction DR2, may be spaced from each other at the separation portion ROP of the sub-region SA. The arrangement of the first electrode RME1 may be formed in such a way that the electrode is formed as a single electrode line extending in the second direction DR2, the light emitting elements ED are arranged, and then in a subsequent process, the electrode line is separated. The electrode line may be used to generate an electric field in the sub-pixel SPXn in order to align the light emitting elements ED during the fabricating process of the display device 10.

After aligning the light emitting elements ED, the electrode line may be separated at the separation portion ROP to form the plurality of electrodes RME separated in the second direction DR2. The process of separating the electrode line may be performed after the process of forming the second insulating layer PAS2, and the second insulating layer PAS2 may not be disposed in the separation portion ROP. The second insulating layer PAS2 may be used as a mask pattern in the process of separating the electrode line.

The electrodes RME may be electrically connected to the light emitting elements ED. Each of the electrodes RME may be connected to the light emitting element ED through connection electrodes CNE (CNE1, CNE2, and CNE3) to be described later, and may transmit an electrical signal applied from the lower conductive layer to the light emitting element ED.

Each of the plurality of electrodes RME may include a conductive material having high reflectivity. For example, the electrode RME may include a metal such as silver (Ag), copper (Cu), or aluminum (Al) as a material having high reflectivity, or may be an alloy including aluminum (Al), nickel (Ni), lanthanum (La), and the like. The electrode RME may reflect the light emitted from the light emitting element ED and proceeding toward the side surfaces of the bank patterns BP1 and BP2 in an upward direction from each sub-pixel SPXn.

However, the present disclosure is not limited thereto, and each electrode RME may further include a transparent conductive material. For example, each electrode RME may include a material such as ITO, IZO, and ITZO. In one or more embodiments, each of the electrodes RME may have a structure in which at least one transparent conductive material and at least one metal layer having high reflectivity are stacked, or may be formed as one layer including them. For example, each electrode RME may have a stacked structure of ITO/Ag/ITO, ITO/Ag/IZO, ITO/Ag/ITZO/IZO, or the like.

The first insulating layer PAS1 is disposed on the via layer VIA, the bank patterns BP1 and BP2, and the plurality of electrodes RME. The first insulating layer PAS1 may be disposed on the via layer VIA to cover the plurality of electrodes RME and the bank patterns BP1 and BP2. In addition, the first insulating layer PAS1 may not be disposed in the separation portion ROP where the electrodes RME, which are adjacent to each other in the second direction DR2, are spaced from each other in the sub-region SA. The first insulating layer PAS1 may protect the plurality of electrodes RME and insulate electrodes RME that are different from each other. In addition, the first insulating layer PAS1 may prevent the light emitting element ED disposed thereon from being damaged by direct contact with other members.

In one or more embodiments, the first insulating layer PAS1 may have stepped portions such that the top surface thereof is partially depressed between the electrodes RME that are spaced in the first direction DR1. The light emitting element ED may be disposed on the top surface of the first insulating layer PAS1, where the stepped portions are formed, and thus a space may remain between the light emitting element ED and the first insulating layer PAS1.

The first insulating layer PAS1 may include a plurality of contact portions CT1 and CT2 that expose a portion of the top surface of each electrode RME. The plurality of contact portions CT1 and CT2 may penetrate the first insulating layer PAS1. In one or more embodiments, the first and second connection electrodes CNE1 and CNE2, which will be described later, may be respectively in contact with the electrodes RME exposed through the contact portions CT1 and CT2.

The bank BNL may be disposed on the first insulating layer PAS1. The bank BNL may include portions extending in the first direction DR1 and the second direction DR2 in a plan view, and thus may be arranged in a grid pattern. The bank BNL may be disposed along the boundaries between the sub-pixels SPXn to delimit the neighboring sub-pixels SPXn. In addition, the bank BNL may be disposed to surround the emission area EMA and the sub-region SA, and areas partitioned and opened by the bank BNL may be the emission area EMA and the sub-region SA, respectively.

The bank BNL may have a certain height, and in one or more embodiments, the height of the top surface of the bank BNL may be higher than that of the bank patterns BP1 and BP2, and the thickness of the bank BNL may be equal to or greater than that of the bank patterns BP1 and BP2. However, the present disclosure is not limited thereto, and the height of the top surface of the bank BNL may be same as or lower than that of the bank patterns BP1 and BP2, and the thickness of the bank BNL may be smaller than that of the bank patterns BP1 and BP2. The bank BNL may prevent ink from overflowing to the adjacent sub-pixel SPXn in an inkjet printing process during the fabricating process of the display device 10. The bank BNL may prevent inks where the different light emitting elements ED are dispersed in the different sub-pixels SPXn from being mixed with each other. Similarly to the bank patterns BP1 and BP2, the bank BNL may include polyimide, but is not limited thereto.

The plurality of light emitting elements ED may be arranged on the first insulating layer PAS1. The light emitting element ED may include a plurality of layers arranged in a direction parallel to the top surface of the substrate SUB. The light emitting element ED of the display device 10 may be disposed such that one extension direction thereof is parallel to the substrate SUB, and the plurality of semiconductor layers included in the light emitting element ED may be sequentially arranged in a direction parallel to the top surface of the substrate SUB. However, the present disclosure is not limited thereto. In some cases, when the light emitting element ED has a different structure, the plurality of layers may be arranged in a direction perpendicular to the substrate SUB.

The light emitting elements ED may be disposed between the bank patterns BP1 and BP2 or on the different electrodes RME. Some of the light emitting elements ED may be disposed between one of the first bank patterns BP1 and the second bank pattern BP2, and other ones of the light emitting elements ED may be disposed between another one of the first bank patterns BP1 and the second bank pattern BP2. According to one or more embodiments, the light emitting element ED may include a first light emitting element ED1 that is disposed between the second bank pattern BP2 and the first bank pattern BP1 disposed at the right side of the emission area EMA, and a second light emitting element ED2 that is disposed between the second bank pattern BP2 and the first bank pattern BP1 disposed at the left side of the emission area EMA. The first light emitting element ED1 may be arranged on the first electrode RME1 and the third electrode RME3, and the second light emitting element ED2 may be arranged on the first electrode RME1 and the second electrode RME2. The first light emitting element ED1 may be disposed adjacent to the right side of the emission area EMA of the corresponding sub-pixel SPXn, and the second light emitting element ED2 may be disposed adjacent to the left side of the emission area EMA of the corresponding sub-pixel SPXn. However, the light emitting elements ED may not be classified according to the arrangement position in the emission area EMA, but may be classified according to a connection relationship with the connection electrode CNE, which will be described later. Both ends of each light emitting element ED may be in contact with different connection electrodes CNE according to an arrangement method of the connection electrodes CNE. The light emitting elements ED may be classified into different types of light emitting elements ED according to the type of the connection electrode CNE in contact therewith.

The light emitting elements ED may be in contact with the connection electrodes CNE1, CNE2, and CNE3 and electrically connected to each other. Because a portion of the semiconductor layer is exposed at the end surfaces of the light emitting elements ED extending in one direction, the exposed semiconductor layer may be in contact with the connection electrodes CNE. The first connection electrode CNE1 may be in contact with one end of the first light emitting element ED1, and a part (e.g., a third-first extension CN_E1) of the third connection electrode CNE3 may be in contact with the other end thereof. The second connection electrode CNE2 may be in contact with one end of the second light emitting element ED2, and the other part (e.g., a third-second extension CN_E2) of the third connection electrode CNE3 may be in contact with the other end thereof. Each of the light emitting elements ED may be electrically connected to the conductive layers under the electrode RME and the via layer VIA through the connection electrodes CNE, and may emit light of a specific wavelength band by being applied with an electrical signal.

The second insulating layer PAS2 may be disposed on the plurality of light emitting elements ED and the first insulating layer PAS1. The second insulating layer PAS2 may extend in the second direction DR2 between the bank patterns BP1 and BP2 and may be disposed on the plurality of light emitting elements ED. The second insulating layer PAS2 may be disposed to be partially around (or surround) the outer surface of the light emitting element ED without covering both sides or both ends of the light emitting element ED. The second insulating layer PAS2 may form a linear or island-like pattern in each sub-pixel SPXn in a plan view. The second insulating layer PAS2 may protect the light emitting elements ED while fixing the light emitting elements ED during the fabricating process of the display device 10. Further, the second insulating layer PAS2 may be disposed to fill the space between the light emitting element ED and the first insulating layer PAS1 thereunder. The second insulating layer PAS2 may be partially disposed on the bank BNL and in the sub-region SA, but the present disclosure is not limited thereto. A portion of the second insulating layer PAS2 disposed in the sub-region SA may not be disposed in the first contact portion CT1, the second contact portion CT2, and the separation portion ROP.

The plurality of connection electrodes CNE1, CNE2, and CNE3 may include the first and second connection electrodes CNE1 and CNE2, which are first type connection electrodes, and the third connection electrode CNE3 which is a third type connection electrode.

The first connection electrode CNE1 may have a shape extending in the second direction DR2 and may be disposed on the first electrode RME1. A portion of the first connection electrode CNE1 disposed on the second protruding pattern BP2 may overlap the first electrode RME1 in the third direction DR3, extend in the second direction DR2 therefrom to cross the bank BNL, and may be disposed up to the sub-region SA positioned on the upper side of the emission area EMA. The first connection electrode CNE1 may be in contact with at least one of the first electrode RME1 or the first conductive pattern CDP1 through the first contact portion CT1 in the sub-region SA.

The second connection electrode CNE2 may have a shape extending in the second direction DR2 and may be disposed on the second electrode RME2. A portion of the second connection electrode CNE2 disposed on the first bank pattern BP1 may overlap the second electrode RME2 in the third direction DR3, extend in the second direction DR2 therefrom to cross the bank BNL, and may be disposed up to the sub-region SA positioned on the upper side of the emission area EMA. The second connection electrode CNE2 may be in contact with the second voltage wire VL2 through the second contact portion CT2 in the sub-region SA.

The third connection electrode CNE3 may be disposed to overlap the first electrode RME1 and the third electrode RME3 in the third direction DR3. For example, the third connection electrode CNE3 may include third extensions CN_E1 and CN_E2 that extend in the second direction DR2, and a first connection portion CN_B1 that connects the third extensions CN_E1 and CN_E2 to each other. A third-first extension CN_E1 is disposed on the third electrode RME3 in the emission area EMA, and a third-second extension CN_E2 is disposed on the first electrode RME1 in the emission area EMA. The first connection portion CN_B1 may extend in the first direction DR1 on the bank BNL, which is disposed at the lower side of the emission area EMA, to connect the third-first extension CN_E1 to the third-second extension CN_E2. The third connection electrode CNE3 may be disposed in the emission area EMA and on the bank BNL, and may not be connected to the third electrode RME3. The third connection electrode CNE3 may not be connected to other wires or electrodes, and thus it may be in a floating state. The third connection electrode CNE3 may transmit a signal applied through the light emitting elements ED. The first light emitting element ED1 and the second light emitting element ED2 may be connected in series only through the third connection electrode CNE3.

The third insulating layer PAS3 may be disposed on the third connection electrode CNE3, the first insulating layer PAS1, and the second insulating layer PAS2. The third insulating layer PAS3 is disposed to cover the third connection electrode CNE3 and thus insulates it from the adjacent first and second connection electrodes CNE1 and CNE2. The first and second connection electrodes CNE1 and CNE2 may be disposed on the third insulating layer PAS3.

In one or more embodiments, an insulating layer may be further disposed on the third insulating layer PAS3, the first connection electrode CNE1, and the second connection electrode CNE2. The insulating layer may function to protect the members disposed on the substrate SUB against the external environment. The first insulating layer PAS1, the second insulating layer PAS2, and the third insulating layer PAS3 described above may include an inorganic insulating material or an organic insulating material.

In one or more embodiments, the first connection electrode CNE1 may be in direct contact with the first conductive pattern CDP1, which is the third conductive layer, in the first contact portion CT1. The second connection electrode CNE2 may be in direct contact with the second voltage wire VL2, which is the third conductive layer, in the second contact portion CT2.

Referring back to FIGS. 4 and 6, in the first contact portion CT1, the first conductive pattern CDP1 may be arranged on the interlayer insulating layer IL, and the passivation layer PVX and the via layer VIA may be arranged on the first conductive pattern CDP1. The first electrode RME1 may be disposed on the via layer VIA. A first opening RH1 is provided in the first electrode RME1 to expose the first conductive pattern CDP1 below the first electrode RME1. The first opening RH1 is a hole formed in the first electrode RME1, and the via layer VIA, and the passivation layer PVX, which are disposed below the first electrode RME1, and the first conductive pattern CDP1 may be exposed through the first opening RH1. The first opening RH1 may overlap the first connection electrode CNE1.

The first insulating layer PAS1 is arranged on the first electrode RME1, and the first connection electrode CNE1 is arranged on the first insulating layer PAS1. The first insulating layer PAS1 completely covers the first electrode RME1 so that the first electrode RME1 is not exposed. The first connection electrode CNE1 may be connected to the first conductive pattern CDP1 through the first opening RH1 of the first electrode RME1, and the first contact portion CT1 penetrating the passivation layer PVX, the via layer VIA, and the first insulating layer PAS1. The first connection electrode CNE1 extends along the side surfaces of the first insulating layer PAS1, the via layer VIA, and the passivation layer PVX, and is in direct contact with the top surface of the first conductive pattern CDP1.

In the second contact portion CT2, a second opening RH2 is formed in the second electrode RME2, so that the second connection electrode CNE2 may also be directly connected to the second voltage wire VL2. The second connection electrode CNE2 may extend along the side surfaces of the first insulating layer PAS1, the via layer VIA, and the passivation layer PVX, and may be in direct contact with the top surface of the second voltage wire VL2. Because the openings RH1 and RH2 have a size larger than the size of the contact portions CT1 and CT2, it is possible to easily achieve the connection between the third conductive layer and the connection electrodes CNE1 and CNE2.

In one or more embodiments, the first opening RH1 and the second opening RH2 are respectively formed in the first electrode RME1 and the second electrode RME2, so that the first connection electrode CNE1 and the second connection electrode CNE2 may be directly connected to the first conductive pattern CDP1 and the second voltage wire VL2, respectively. The electrodes RME1 and RME2 may be formed of a metal having low resistance and high reflectivity, such as aluminum. Aluminum reacts with oxygen to form an oxide film. When the connection electrodes CNE1 and CNE2 are respectively connected to the first conductive pattern CDP1 and the second voltage wire VL2, which are the third conductive layer, via the electrodes RME1 and RME2, the contact resistance may increase due to an oxide film formed on the surface of each electrode RME1 and RME2. Accordingly, luminance may be deteriorated and dark spots may occur. In the present disclosure, the first opening RH1 and the second opening RH2 are respectively formed in the first electrode RME1 and the second electrode RME2, so that the first connection electrode CNE1 and the second connection electrode CNE2 may be directly connected to the first conductive pattern CDP1 and the second voltage wire VL2, respectively. Accordingly, the contact resistance between the connection electrodes CNE1 and CNE2 and the third conductive layer, that is, the first conductive pattern CDP1 and/or the second voltage wire VL2 may be decreased, thereby preventing or reducing luminance deterioration and generation of dark spots.

In one or more embodiments, the second voltage wire VL2 and the first conductive pattern CDP1, which are the third conductive layer, may have a three-layered structure. For example, the third conductive layer may include a first layer MT1, a second layer MT2 and a third layer MT3 that are sequentially arranged from the bottom. The first layer MT1 may be made of titanium, the second layer MT2 may be made of copper, and the third layer MT3 may include at least one of titanium (Ti), titanium nitride (TiN), tantalum (Ta), tantalum nitride (TaN), tungsten (W), ruthenium (Ru), chromium (Cr), molybdenum (Mo), or cobalt (Co). For example, the third conductive layer may have a three-layered structure of titanium/copper/titanium.

In the case where the third conductive layer has two layers of titanium/copper, the copper layer is arranged at the top. When the copper layer is exposed, it may be easily corroded by an etchant during wet etching of the electrodes RME. In one embodiment, in the second voltage wire VL2 and the first conductive pattern CDP1, which are the third conductive layer, because the third layer MT3 is formed on the copper layer of the second layer MT2, it is possible to prevent or reduce corrosion of the copper layer of the second layer MT2.

In one or more embodiments, the third conductive layer may have a four-layered structure by further including a fourth layer MT4 that is arranged on the third layer MT3. The fourth layer MT4 may be indium tin oxide (ITO) or copper. For example, the third conductive layer may have a four-layered structure of titanium/copper/titanium/indium tin oxide, or titanium/copper/titanium/copper. In the case where the fourth layer MT4 is made of indium tin oxide, when the third conductive layer is formed in a pad portion, designing the pad portion can be easily achieved. In the case where the fourth layer MT4 is made of copper, when the third conductive layer is collectively etched, it is possible to prevent the profile of the third layer MT3 from being deteriorated.

Figure 9:
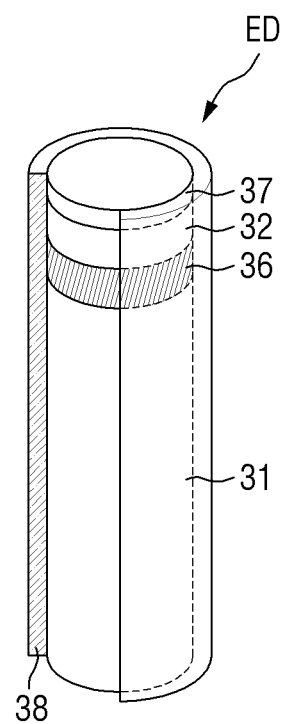
FIG. 9 is a perspective cutaway view showing a light emitting element according to one or more embodiments.

FIG. 9 is a perspective cutaway view showing a light emitting element according to one or more embodiments.

Referring to FIG. 9, the light emitting element ED may be a light emitting diode. For example, the light emitting element ED may be an inorganic light emitting diode that has a nanometer or micrometer size, and is made of an inorganic material. The light emitting element ED may be aligned between two electrodes having polarity when an electric field is formed in a specific direction between two electrodes opposing each other.

The light emitting element ED according to one or more embodiments may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in one direction and having an outer surface partially inclined.

The light emitting element ED may include a semiconductor layer doped with any conductivity type (e.g., p-type or n-type) impurities. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of n-type doped AlGaInN, GaN, AlGaN, InGaN, AlN and InN. The n-type dopant doped into the first semiconductor layer 31 may be Si, Ge, Sn, or the like.

The second semiconductor layer 32 is disposed on the first semiconductor layer 31 with the light emitting layer 36 interposed therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of p-type doped AlGaInN, GaN, AlGaN, InGaN, AlN and InN. The p-type dopant doped into the second semiconductor layer 32 may be Mg, Zn, Ca, Se, Ba, or the like.

Although it is illustrated in the drawing that the first semiconductor layer 31 and the second semiconductor layer 32 are configured as one layer, the present disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material such as AlGaN or AlGaInN. For example, when the light emitting layer 36 has a structure in which quantum layers and well layers are alternately stacked in a multiple quantum well structure, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked, and may include other Group III to V semiconductor materials according to the wavelength band of the emitted light. The light emitted by the light emitting layer 36 is not limited to light of a blue wavelength band, but the active layer 36 may also emit light of a red or green wavelength band in some cases.

The electrode layer 37 may be disposed on the second semiconductor layer 32 and/or on the first semiconductor layer 31. The electrode layer 37 may be an ohmic connection electrode. However, the present disclosure is not limited thereto, and it may be a Schottky connection electrode. The light emitting element ED may include at least one electrode layer 37. The light emitting element ED may include one or more electrode layers 37, but the present disclosure is not limited thereto, and the electrode layer 37 may be omitted.

In the display device 10, when the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 may be around (or surround) the outer surfaces (e.g. outer peripheral surfaces) of the plurality of semiconductor layers and electrode layers of the light emitting element ED described above. For example, the insulating film 38 may be disposed to be around (or surround) at least the outer surface (e.g. an outer peripheral surface) of the light emitting layer 36, and may be formed to expose both ends of the light emitting element ED in the longitudinal direction. Further, in cross-sectional view, the insulating film 38 may have a top surface, which is rounded in a region adjacent to at least one end of the light emitting element ED.

The insulating film 38 may include a material having insulating properties, such as silicon oxide ($SiO_x$), silicon nitride ($SiN_x$), silicon oxynitride ($SiO_xN_y$), aluminum nitride ($AlN_x$), and aluminum oxide ($AlO_x$). It is illustrated in the drawing that the insulating film 38 is formed as a single layer, but the present disclosure is not limited thereto. In one or more embodiments, the insulating film 38 may be formed in a multilayer structure having a plurality of layers stacked therein.

The insulating film 38 may function to protect the members. The insulating film 38 may prevent an electrical short circuit that is likely to occur at the light emitting layer 36 when an electrode to which an electrical signal is transmitted is in direct contact with the light emitting element ED. In addition, the insulating film 38 may prevent a decrease in luminous efficiency of the light emitting element ED.

Further, the insulating film 38 may have an outer surface (e.g. an outer peripheral surface) that is surface-treated. The light emitting elements ED may be aligned in such a way of spraying the ink in which the light emitting elements ED are dispersed on the electrodes. Here, the surface of the insulating film 38 may be treated in a hydrophobic or hydrophilic manner in order to keep the light emitting elements ED in a dispersed state without aggregation with other light emitting elements ED adjacent in the ink.

In the display device 10 according to one embodiment, structures of the first and second contact portions CT1 and CT2 may be variously modified. Hereinafter, other embodiments of the display device 10 will be described with reference to other drawings.

Figure 10:
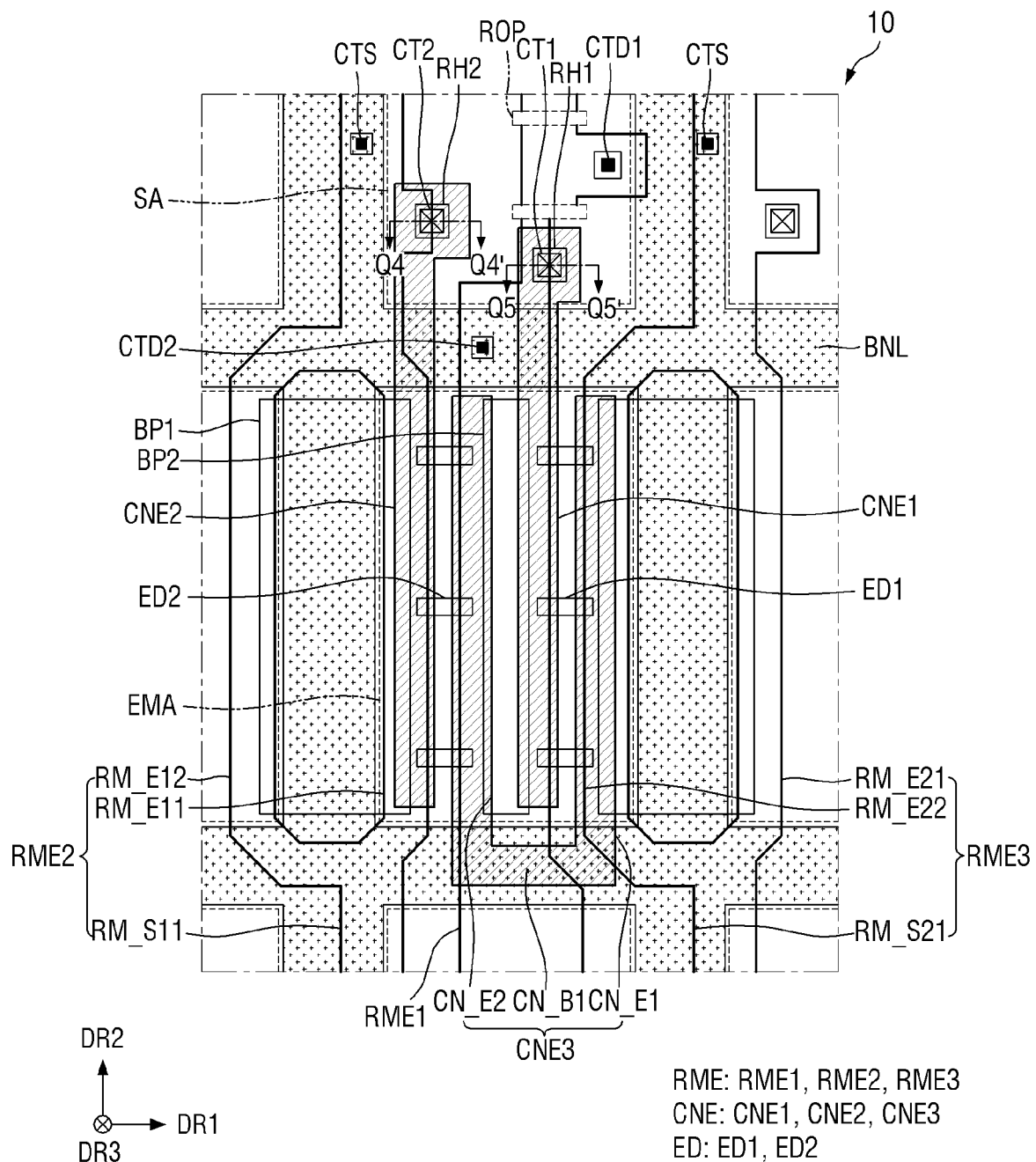
FIG. 10 is a plan view illustrating a sub-pixel of a display device according to one or more embodiments.
Figure 11:
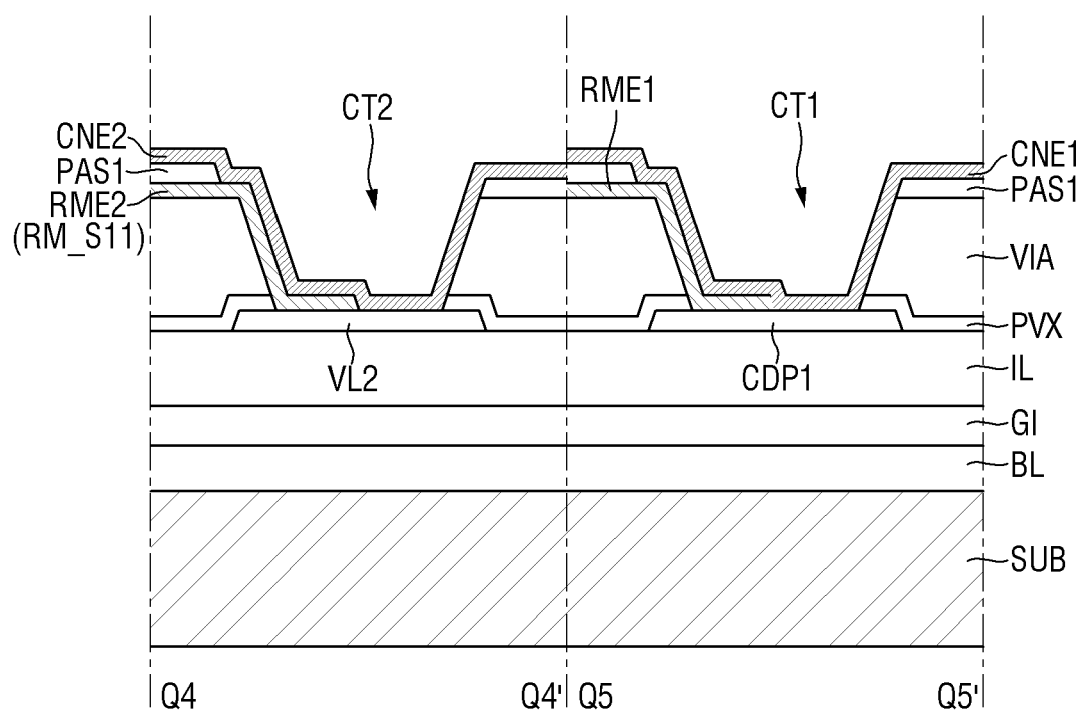
FIG. 11 is a cross-sectional view taken along the lines Q4-Q4' and Q5-Q5' of FIG. 10.

FIG. 10 is a plan view illustrating a sub-pixel of a display device according to one or more embodiments. FIG. 11 is a cross-sectional view taken along the lines Q4-Q4' and Q5-Q5' of FIG. 10.

Referring to FIGS. 10 and 11, one sub-pixel SPXn may include the electrodes RME1, RME2, and/or RME3, the connection electrodes CNE1, CNE2, and/or CNE3, and the third conductive layer. The connection electrodes CNE1 and CNE2 may be in direct contact with the third conductive layer. The embodiment of FIGS. 10 and 11 is different from the above-described embodiment of FIGS. 4-8 in that the electrodes RME1 and RME2 are in direct contact with the third conductive layer. Hereinafter, a description of the same components will be omitted, and a description will be given of different components.

In the first contact portion CT1, the first conductive pattern CDP1 is arranged on the interlayer insulating layer IL, and the passivation layer PVX and the via layer VIA are arranged on the first conductive pattern CDP1. The first electrode RME1 is disposed on the via layer VIA. The first insulating layer PAS1 is arranged on the first electrode RME1, and the first connection electrode CNE1 is arranged on the first insulating layer PAS1.

The first contact portion CT1 penetrates the passivation layer PVX, the via layer VIA, and the first insulating layer PAS1 to expose the first conductive pattern CDP1. The first electrode RME1 may be in contact with a region of the first conductive pattern CDP1 through the first contact portion CT1. The first electrode RME1 extends to the top surface of the first conductive pattern CDP1 along the side surfaces of the via layer VIA and the passivation layer PVX, so that it may be in direct contact with the top surface of the first conductive pattern CDP1. Because the first electrode RME1 overlaps at least a portion of the first conductive pattern CDP1 at the first contact portion CT1, the first electrode RME1 is in contact with at least one region of the top surface of the first conductive pattern CDP1 and is not in contact with the remaining region thereof to expose the top surface of the first conductive pattern CDP1.

The first connection electrode CNE1 may be in contact with the first electrode RME1 and the first conductive pattern CDP1 through the first contact portion CT1. The first connection electrode CNE1 may overlap the first electrode RME1 on one region of the first conductive pattern CDP1. The first connection electrode CNE1 may not overlap the first electrode RME1 on the remaining region of the first conductive pattern CDP1. The first connection electrode CNE1 extends along the side surface of the first insulating layer PAS1 and the top surface of the first electrode RME1, and is in direct contact with the first electrode RME1 in a region where it overlaps the first electrode RME1. The first connection electrode CNE1 may extend along the side surfaces of the first insulating layer PAS1, the via layer VIA, and the passivation layer PVX, and may be in direct contact with the first conductive pattern CDP1 in a region where it does not overlap the first electrode RME1.

Because the first connection electrode CNE1 overlaps the entire first contact portion CT1, a part thereof may be in direct contact with the first electrode RME1 and the remaining part thereof may be in direct contact with the first conductive pattern CDP1. Therefore, even when an oxide film is formed on the first electrode RME1, the first connection electrode CNE1 is in direct contact with the first conductive pattern CDP1, so that the contact resistance between the first connection electrode CNE1 and the first conductive pattern CDP1 can be decreased.

In the second contact portion CT2, the second voltage wire VL2 is arranged on the interlayer insulating layer IL, and the passivation layer PVX and the via layer VIA are arranged on the second voltage wire VL2. The second electrode RME2 is disposed on the via layer VIA. The first insulating layer PAS1 is disposed on the second electrode RME2, and the second connection electrode CNE2 is disposed on the first insulating layer PAS1.

The second contact portion CT2 penetrates the passivation layer PVX, the via layer VIA, and the first insulating layer PAS1 to expose the second voltage wire VL2. The second electrode RME2 may be in contact with a region of the second voltage wire VL2 through the second contact portion CT2. The second electrode RME2 extends to the top surface of the second voltage wire VL2 along the side surfaces of the via layer VIA and the passivation layer PVX, so that it may be in direct contact with the top surface of the second voltage wire VL2. The second electrode RME2 overlaps at least a portion of the second contact portion CT2, so that the second electrode RME2 is in contact with at least one region of the top surface of the second voltage wire VL2 and is not in contact with the remaining region of the top surface thereof to expose the top surface of the second voltage wire VL2.

The second connection electrode CNE2 may be in contact with the second electrode RME2 and the second voltage wire VL2 through the second contact portion CT2. The second connection electrode CNE2 extends along the side surface of the first insulating layer PAS1 and the top surface of the second electrode RME2, and is in direct contact with the second electrode RME2 in a region where it overlaps the second electrode RME2. The second connection electrode CNE2 may extend along the side surfaces of the first insulating layer PAS1, the via layer VIA, and the passivation layer PVX, and may be in direct contact with the second voltage wire VL2 in a region where it does not overlap the second electrode RME2.

Because the second connection electrode CNE2 overlaps the entire second contact portion CT2, a part thereof may be in direct contact with the second electrode RME2 and the remaining part thereof may be in direct contact with the second voltage wire VL2. Therefore, even when an oxide film is formed on the second electrode RME2, the second connection electrode CNE2 is in direct contact with the second voltage wire VL2, so that the contact resistance between the second connection electrode CNE2 and the second voltage wire VL2 can be decreased.

Figure 12:
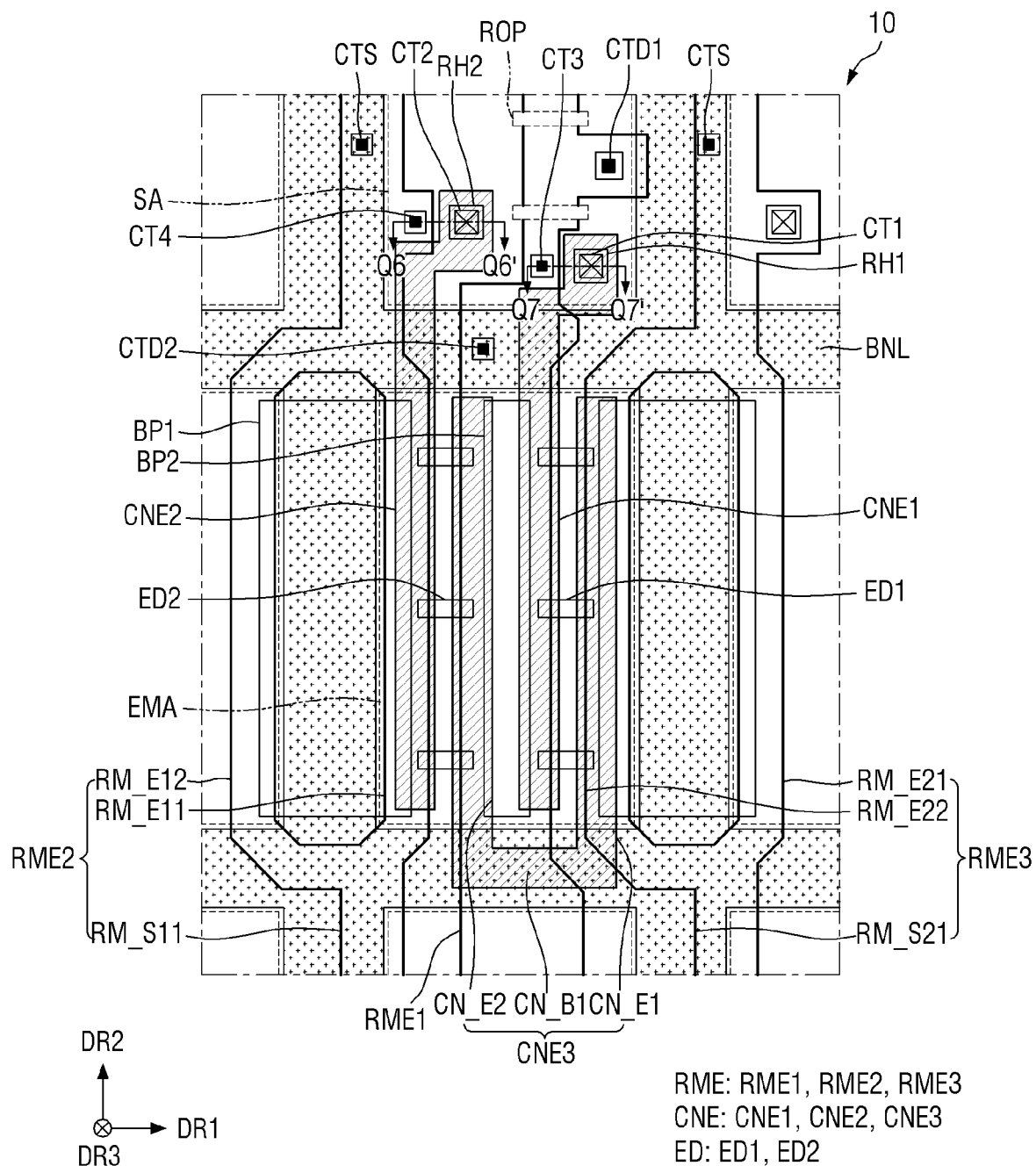
FIG. 12 is a plan view illustrating a sub-pixel of a display device according to one or more embodiments.
Figure 13:
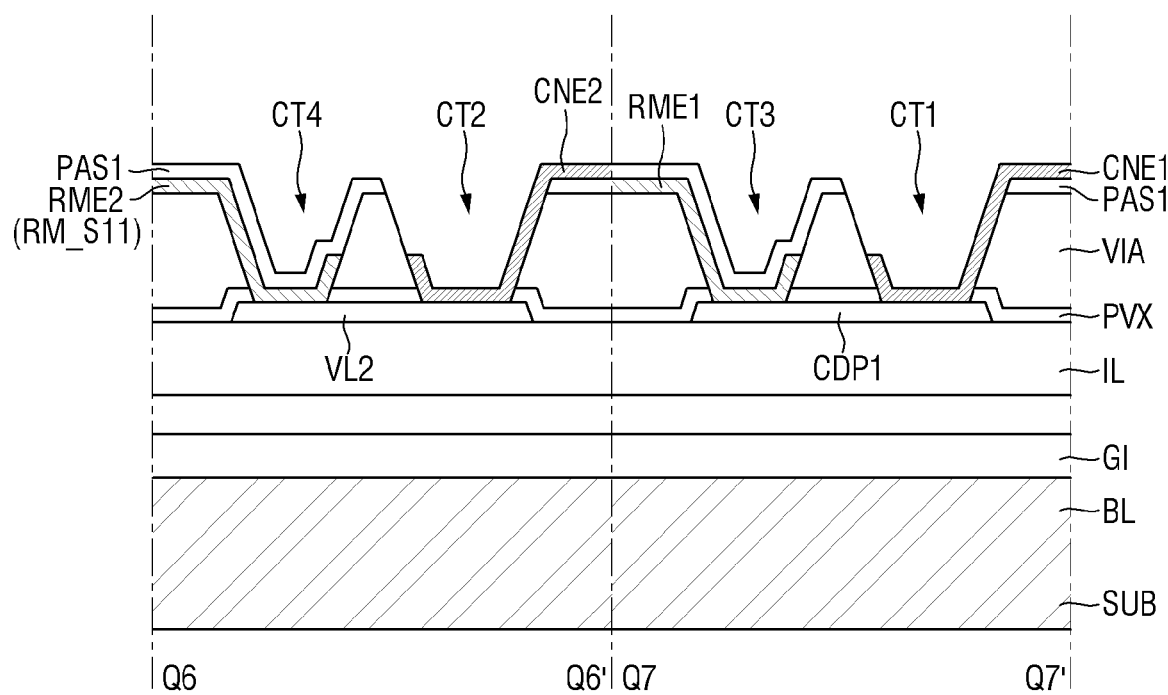
FIG. 13 is a cross-sectional view taken along the lines Q6-Q6' and Q7-Q7' of FIG. 12.

FIG. 12 is a plan view illustrating a sub-pixel of a display device according to one or more embodiments. FIG. 13 is a cross-sectional view taken along the lines Q6-Q6' and Q7-Q7' of FIG. 12.

Referring to FIGS. 12 and 13, one sub-pixel SPXn may include at least the electrodes RME1, RME2, and RME3 the connection electrodes CNE1, CNE2, and CNE3, and the third conductive layer. The connection electrodes CNE1 and CNE2 may be in direct contact with the third conductive layer. The embodiment of FIGS. 12 and 13 is different from the above-described embodiments of FIGS. 4-11 in that contact portions where the third conductive layer and the electrodes RME1 and RME2 are in contact with each other are different from contact portions where the third conductive layer and the connection electrodes CNE1 and CNE2 are in contact with each other. Hereinafter, a description of the same components will be omitted, and a description will be given of different components.

The first connection electrode CNE1 is connected to the third conductive layer at the first contact portion CT1, and the first electrode RME1 is connected to the third conductive layer at a third contact portion CT3. The first contact portion CT1 and the third contact portion CT3 are disposed to be spaced from each other in the first direction DR1. The first electrode RME1 is disposed not to overlap the first contact portion CT1, and the first connection electrode CNE1 is disposed not to overlap the third contact portion CT3.

In the first contact portion CT1, the first conductive pattern CDP1, which is the third conductive layer, is arranged on the interlayer insulating layer IL, and the passivation layer PVX and the via layer VIA are arranged on the first conductive pattern CDP1. The first insulating layer PAS1 is arranged on the via layer VIA, and the first connection electrode CNE1 is arranged on the first insulating layer PAS1. The first contact portion CT1 penetrates the first insulating layer PAS1, the via layer VIA, and the passivation layer PVX to expose the first conductive pattern CDP1. The first connection electrode CNE1 may be in contact with the first conductive pattern CDP1 through the first contact portion CT1. The first connection electrode CNE1 extends to the top surface of the first conductive pattern CDP1 along the side surfaces of the first insulating layer PAS1, the via layer VIA, and the passivation layer PVX, so that it may be in direct contact with the top surface of the first conductive pattern CDP1.

In the third contact portion CT3, the first conductive pattern CDP1, which is the third conductive layer, is arranged on the interlayer insulating layer IL, and the passivation layer PVX and the via layer VIA are arranged on the first conductive pattern CDP1. The first electrode RME1 is disposed on the via layer VIA, and the first insulating layer PAS1 is disposed on the first electrode RME1. The third contact portion CT3 penetrates the via layer VIA and the passivation layer PVX to expose the first conductive pattern CDP1. The first electrode RME1 may be in contact with the first conductive pattern CDP1 through the third contact portion CT3. The first electrode RME1 may extend to the top surface of the first conductive pattern CDP1 along the side surfaces of the via layer VIA and the passivation layer PVX, so that it may be in direct contact with the top surface of the first conductive pattern CDP1. The first insulating layer PAS1 completely covers the first electrode RME1.

In the first and third contact portions CT1 and CT3, the first connection electrode CNE1 may not overlap the first electrode RME1. The first connection electrode CNE1 may be in contact with the third conductive layer through the first contact portion CT1, and the first electrode RME1 may be in contact with the third conductive layer through the third contact portion CT3. Therefore, because the first electrode RME1 is not disposed between the first connection electrode CNE1 and the third conductive layer, the contact resistance between the first connection electrode CNE1 and the first conductive pattern CDP1 can be decreased.

In the second contact portion CT2, the second voltage wire VL2, which is the third conductive layer, is arranged on the interlayer insulating layer IL, and the passivation layer PVX and the via layer VIA are arranged on the second voltage wire VL2. The first insulating layer PAS1 is disposed on the via layer VIA, and the second connection electrode CNE2 is disposed on the first insulating layer PAS1. The second contact portion CT2 penetrates the first insulating layer PAS1, the via layer VIA, and the passivation layer PVX to expose the second voltage wire VL2. The second connection electrode CNE2 may be in contact with the second voltage wire VL2 through the second contact portion CT2. The second connection electrode CNE2 extends to the top surface of the second voltage wire VL2 along the side surfaces of the first insulating layer PAS1, the via layer VIA, and the passivation layer PVX, so that it may be in direct contact with the top surface of the second voltage wire VL2.

In a fourth contact portion CT4, the second voltage wire VL2, which is the third conductive layer, is arranged on the interlayer insulating layer IL, and the passivation layer PVX and the via layer VIA are arranged on the second voltage wire VL2. The second electrode RME2 is disposed on the via layer VIA, and the first insulating layer PAS1 is disposed on the second electrode RME2. The fourth contact portion CT4 penetrates the via layer VIA and the passivation layer PVX to expose the second voltage wire VL2. The second electrode RME2 may be in contact with the second voltage wire VL2 through the fourth contact portion CT4. The second electrode RME2 extends to the top surface of the second voltage wire VL2 along the side surfaces of the via layer VIA and the passivation layer PVX, so that it may be in direct contact with the top surface of the second voltage wire VL2. The first insulating layer PAS1 completely covers the second electrode RME2.

In the second and fourth contact portions CT2 and the CT4, the second connection electrode CNE2 may not overlap the second electrode RME2. The second connection electrode CNE2 may be in contact with the third conductive layer through the second contact portion CT2, and the second electrode RME2 may be in contact with the third conductive layer through the fourth contact portion CT4. Therefore, because the second electrode RME2 is not disposed between the second connection electrode CNE2 and the third conductive layer, the contact resistance between the second connection electrode CNE2 and the second voltage wire VL2 can be decreased.

Figure 14:
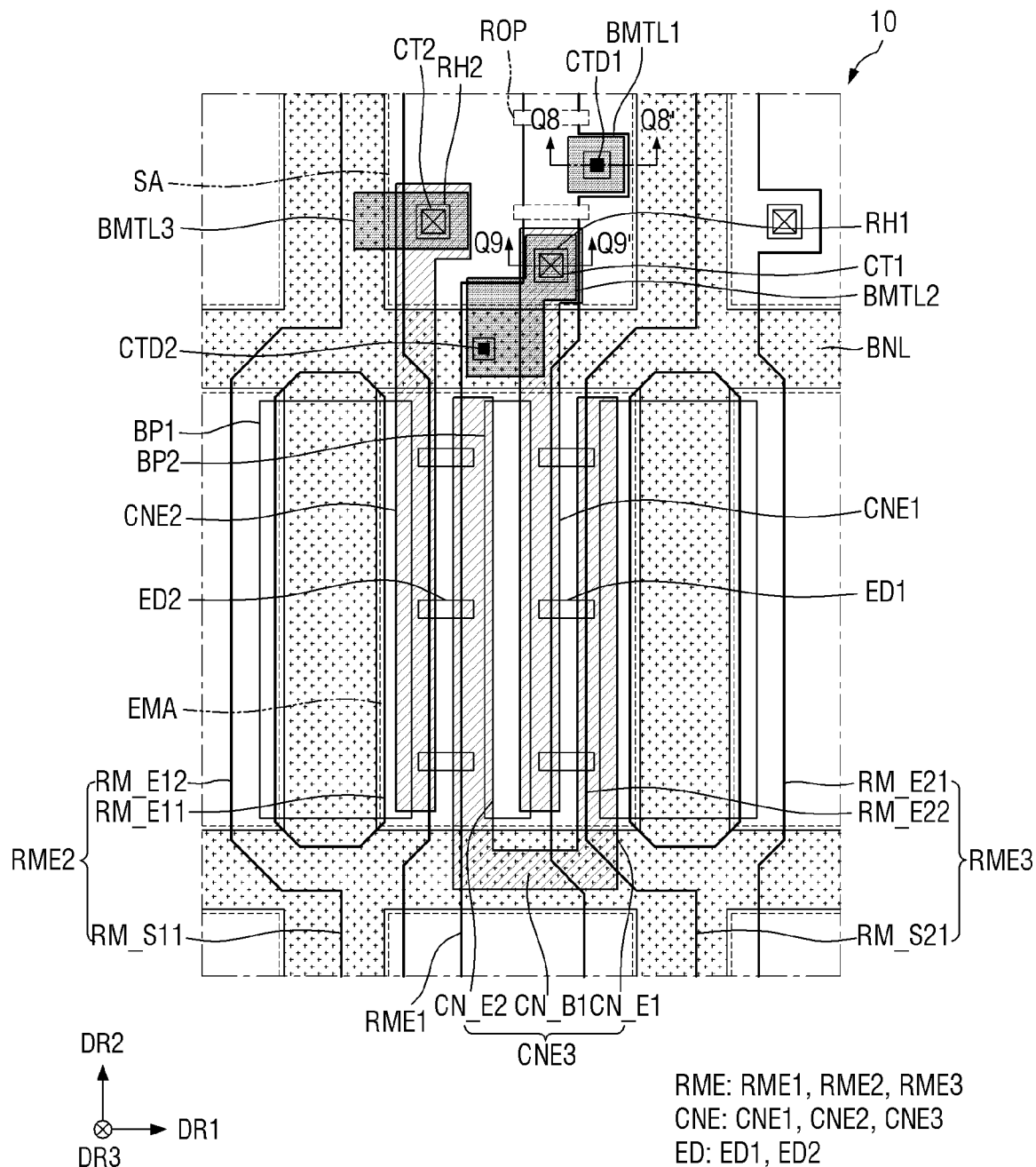
FIG. 14 is a plan view illustrating a sub-pixel of a display device according to one or more embodiments.
Figure 15:
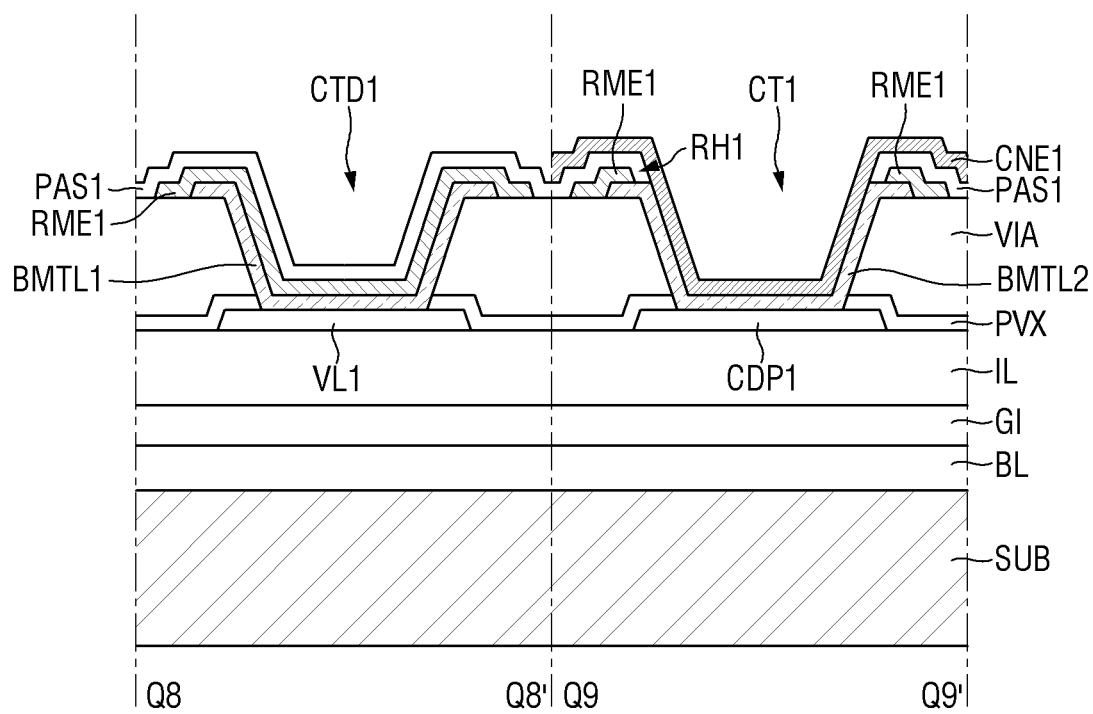
FIG. 15 is a cross-sectional view taken along the lines Q8-Q8' and Q9-Q9' of FIG. 14.

FIG. 14 is a plan view illustrating a sub-pixel of a display device according to one or more embodiments. FIG. 15 is a cross-sectional view taken along the lines Q8-Q8' and Q9-Q9' of FIG. 14.

Referring to FIGS. 14 and 15, one sub-pixel SPXn may include at least the electrodes RME1, RME2, and RME3, the connection electrodes CNE1, CNE2, and CNE3, and the third conductive layer. The embodiment of FIGS. 14 and 15 is different from the above-described embodiments of FIGS. 4-13 in that a bridge layer is disposed between the third conductive layer and the electrodes RME1 and RME2, and between the third conductive layer and the connection electrodes CNE1 and CNE2. Hereinafter, a description of the same components will be omitted, and a description will be given of different components.

The first electrode RME1 may be connected to the third conductive layer in each of the electrode contact holes CTD1 and CTD2. In the first-first electrode contact hole CTD1, the first electrode RME1 may be connected to a first voltage wire VL1, and in the first-second electrode contact hole CTD2, the first electrode RME1 may be connected to the first conductive pattern CDP1. The second electrode RME2 (or the third electrode) may be connected to the third conductive layer in the second contact portion CT2. In FIG. 4 described above, the second electrode RME2 is connected to the third conductive layer in the second electrode contact hole CTS. However, in this embodiment, the second electrode RME2 may be connected to the third conductive layer together with the second contact electrode CNE2 in the second contact portion CT2, and the second electrode contact hole CTS may be omitted. The first connection electrode CNE1 may be connected to the third conductive layer in the first contact portion CT1, and the second connection electrode CNE2 may be connected to the third conductive layer in the second contact portion CT2.

In one embodiment, bridge layers BMTL1, BMTL2, and BMTL3 may be disposed in the first-first electrode contact hole CTD1, the first-second electrode contact hole CTD2, the first contact portion CT1, and the second contact portion CT2. Each of the bridge layers BMTL1, BMTL2, and BMTL3 may be arranged in an island-like shape, thereby decreasing the contact resistance between the electrodes RME and the third conductive layer and between the connection electrodes CNE and the third conductive layer. The bridge layers BMTL1, BMTL2, and BMTL3 may include a first bridge layer BMTL1, a second bridge layer BMTL2, and a third bridge layer BMTL3. The first bridge layer BMTL1 may be disposed in the first-first electrode contact hole CTD1 to be disposed between the first electrode RME1 and the third conductive layer (e.g., the first voltage wire VL1). The first bridge layer BMTL1 may not overlap the first connection electrode CNE1 and the bank BNL. The second bridge layer BMTL2 may be disposed in the first contact portion CT1 and the first-second electrode contact hole CTD2 to be disposed between the first electrode RME1 and the third conductive layer (e.g., the first conductive pattern CDP1), and between the first connection electrode CNE1 and the third conductive layer (e.g., the first conductive pattern CDP1). The second bridge layer BMTL2 may overlap the first connection electrode CNE1 in the third direction DR3, and at least a portion of the second bridge layer BMTL2 may overlap the bank BNL. The third bridge layer BMTL3 may be disposed in the second contact portion CT2 to be disposed between the second electrode RME2 and the third conductive layer (e.g., the second voltage wire VL2).

Because the cross-sectional structure of the first contact portion CT1 is similar to that of the second contact portion CT2, and the cross-sectional structure of the first-first electrode contact hole CTD1 is similar to that of the first-second electrode contact hole CTD2, FIG. 15 illustrates the cross sections of the first-first electrode contact hole CTD1 and the first contact portion CT1 as an example.

Referring to FIG. 15, in the first-first electrode contact hole CTD1, the first voltage wire VL1, which is the third conductive layer, is arranged on the interlayer insulating layer IL, and the passivation layer PVX and the via layer VIA are arranged on the first voltage wire VL1. The first-first electrode contact hole CTD1 penetrates the via layer VIA and the passivation layer PVX to expose the first voltage wire VL1. The first bridge layer BMTL1 is disposed on the via layer VIA and the first voltage wire VL1. The first bridge layer BMTL1 extends to the first voltage wire VL1 along the via layer VIA and the passivation layer PVX, so that it may be in direct contact with the top surface of the first voltage wire VL1.

The first electrode RME1 is disposed on the via layer VIA and the first bridge layer BMTL1. The first electrode RME1 may be in direct contact with the top surface of the first bridge layer BMTL1 while covering the first bridge layer BMTL1. The first electrode RME1 is connected to the first voltage wire VL1 via the first bridge layer BMTL1. The first insulating layer PAS1 may be arranged on the via layer VIA and the first electrode RME1 to cover the first electrode RME1. The first bridge layer BMTL1 is disposed between the first electrode RME1 and the first voltage wire VL1, thereby decreasing the contact resistance between the first electrode RME1 and the first voltage wire VL1.

In the first contact portion CT1, the first conductive pattern CDP1, which is the third conductive layer, is arranged on the interlayer insulating layer IL, and the passivation layer PVX and the via layer VIA are arranged on the first conductive pattern CDP1. The second bridge layer BMTL2 is disposed on the via layer VIA and the first conductive pattern CDP1. The second bridge layer BMTL2 extends to the first conductive pattern CDP1 along the via layer VIA and the passivation layer PVX through the first contact portion CT1, so that it may be in direct contact with the top surface of the first conductive pattern CDP1.

The first electrode RME1 is disposed on the via layer VIA and the second bridge layer BMTL2. The first electrode RME1 may be in direct contact with the top surface of the second bridge layer BMTL2 while covering the second bridge layer BMTL2. The first electrode RME1 may be connected to the first conductive pattern CDP1 and the first connection electrode CNE1 via the second bridge layer BMTL2. The first opening RH1 is provided in the first electrode RME1 to expose the second bridge layer BMTL2 under the first electrode RME1. The first opening RH1 is a hole formed in the first electrode RME1, and the second bridge layer BMTL2 disposed under the first electrode RME1 may be exposed through the first opening RH1.

The first insulating layer PAS1 may be disposed on the via layer VIA and the first electrode RME1 to cover the first electrode RME1. The first insulating layer PAS1 exposes the underlying second bridge layer BMTL2 through the first contact portion CT1. The first connection electrode CNE1 is arranged on the first insulating layer PAS1 and the second bridge layer BMTL2. The first connection electrode CNE1 may extend along the side surface of the first insulating layer PAS1 to be in direct contact with the top surface of the second bridge layer BMTL2. The first connection electrode CNE1 is connected to the first conductive pattern CDP1 via the second bridge layer BMTL2. The second bridge layer BMTL2 is disposed between the first connection electrode CNE1 and the first conductive pattern CDP1, thereby decreasing the contact resistance between the first connection electrode CNE1 and the first conductive pattern CDP1.

In concluding the detailed description, those skilled in the art will appreciate that many variations and modifications can be made to the embodiments of the present disclosure without substantially departing from the spirit and scope of the present disclosure as set forth in the following claims and equivalents thereof. Therefore, the embodiments of the present disclosure are used in a generic and descriptive sense only and not for purposes of limitation.

What is claimed is:

1. A display device comprising:
conductive layers on a substrate;
a via layer on the conductive layers;
a first electrode and a second electrode extending in one direction on the via layer and spaced from each other;
a first insulating layer on the first electrode and the second electrode;
a plurality of light emitting elements on the first insulating layer, each of the light emitting elements having one end on the first electrode and an other end on the second electrode; and
a first connection electrode and a second connection electrode on the first insulating layer, the first connection electrode overlapping the first electrode, and the second connection electrode overlapping the second electrode,
wherein the first connection electrode and the second connection electrode are in contact with the conductive layers through contact portions.

2. The display device of claim 1, wherein the conductive layers comprise a voltage wire and a conductive pattern connected to a transistor.

3. The display device of claim 2, wherein the contact portions comprise a first contact portion exposing the conductive pattern and a second contact portion exposing the voltage wire, wherein the first connection electrode is in contact with the conductive pattern through the first contact portion, and wherein the second connection electrode is in contact with the voltage wire through the second contact portion.

4. The display device of claim 3, wherein the first electrode includes a first opening overlapping the first connection electrode and the first contact portion, wherein the second electrode includes a second opening overlapping the second connection electrode and the second contact portion, wherein the first connection electrode is in contact with the conductive pattern through the first contact portion and the first opening, and wherein the second connection electrode is in contact with the voltage wire through the second contact portion and the second opening.

5. The display device of claim 3, wherein the first electrode is in contact with one region of the conductive pattern through the first contact portion, wherein the first connection electrode is in contact with the first electrode and a remaining region of the conductive pattern through the first contact portion, wherein the second electrode is in contact with one region of the voltage wire through the second contact portion, and wherein the second connection electrode is in contact with the second electrode and a remaining region of the voltage wire through the second contact portion.

6. The display device of claim 5, wherein the first connection electrode and the first electrode overlap each other on the one region of the conductive pattern, and the first connection electrode and the first electrode do not overlap on the remaining region of the conductive pattern.

7. The display device of claim 3, wherein the contact portions further comprise a third contact portion that exposes the conductive pattern and is spaced from the first contact portion, and a fourth contact portion that exposes the voltage wire and is spaced from the second contact portion, wherein the first connection electrode is in contact with the conductive pattern through the first contact portion, wherein the first electrode is in contact with the conductive pattern through the third contact portion, wherein the second connection electrode is in contact with the voltage wire through the second contact portion, and wherein the second electrode is in contact with the voltage wire through the fourth contact portion.

8. The display device of claim 7, wherein the first connection electrode and the first electrode do not overlap in the first contact portion or the third contact portion, and wherein the second connection electrode and the second electrode do not overlap in the second contact portion or the fourth contact portion.

9. The display device of claim 1, wherein the conductive layers comprise a first layer, a second layer on the first layer, and a third layer on the second layer, and
wherein the first layer and the third layer comprise titanium and the second layer comprises copper.

10. The display device of claim 9, wherein the conductive layers further comprise a fourth layer on the third layer, wherein the fourth layer comprises indium tin oxide or titanium.

11. The display device of claim 1, further comprising a bank partitioning an emission area of a sub-pixel of the display device and a sub-region of the sub-pixel that is spaced from the emission area in the one direction, wherein the plurality of light emitting elements are located in the emission area,
wherein the contact portions are in the sub-region.

12. The display device of claim 1, further comprising:
a third electrode located on the via layer and facing the first electrode; and
a third connection electrode located on the first insulating layer and overlapping the first electrode and the third electrode.

13. The display device of claim 12, wherein the plurality of light emitting elements comprises a first light emitting element on the first electrode and the third electrode, and a second light emitting element on the third electrode and the second electrode,
wherein the first connection electrode is in contact with one end of the first light emitting element, and a portion of the third connection electrode is in contact with an other end of the first light emitting element, and
wherein the second connection electrode is in contact with one end of the second light emitting element, and another portion of the third connection electrode is in contact with an other end of the second light emitting element.

14. The display device of claim 1, wherein the plurality of light emitting elements comprises a first semiconductor layer, a light emitting layer on the first semiconductor layer, a second semiconductor layer on the light emitting layer, an electrode layer on the second semiconductor layer, and an insulating film that is around the first semiconductor layer, the light emitting layer, the second semiconductor layer, and the electrode layer.

15. A display device comprising:
conductive layers on a substrate;
a via layer on the conductive layers;
bridge layers on the via layer and the conductive layers and in contact with the conductive layers;
a first electrode and a second electrode extending in one direction on the via layer and the bridge layers, the first electrode and the second electrode being spaced from each other;
a first insulating layer on the first electrode and the second electrode;
a plurality of light emitting elements on the first insulating layer, each of the light emitting elements having one end on the first electrode and an other end on the second electrode; and
a first connection electrode and a second connection electrode on the first insulating layer, the first connection electrode overlapping the first electrode, and the second connection electrode overlapping the second electrode,
wherein the first electrode is in contact with one of the bridge layers through a first electrode contact hole, and the first connection electrode is in contact with an other one of the bridge layers through a first contact portion.

16. The display device of claim 15, wherein the conductive layers comprise a voltage wire and a conductive pattern connected to a transistor,
wherein the bridge layers comprise a first bridge layer that does not overlap the first connection electrode and a second bridge layer that overlaps the first connection electrode, and
wherein the voltage wire is in contact with the first bridge layer and the conductive pattern is in contact with the second bridge layer.

17. The display device of claim 16, wherein the first electrode is in contact with the first bridge layer to be connected to the voltage wire, and the first connection electrode is in contact with the second bridge layer to be connected to the conductive pattern.

18. The display device of claim 17, further comprising a passivation layer between the conductive layers and the via layer,
wherein the first electrode contact hole penetrates the via layer and the passivation layer to expose the voltage wire, and the first contact portion penetrates the via layer and the passivation layer to expose the conductive pattern.

19. The display device of claim 16, further comprising a bank partitioning an emission area of a sub-pixel of the display device and a sub-region of the sub-pixel that is spaced from the emission area in the one direction, wherein the plurality of light emitting elements are located at the emission area,
wherein the first bridge layer does not overlap the bank and at least a portion of the second bridge layer overlaps the bank.

20. The display device of claim 16, wherein the first electrode includes a first opening overlapping the first connection electrode and the first contact portion, and wherein the first connection electrode is in contact with the second bridge layer through the first contact portion and the first opening.

21. The display device of claim 20, wherein the first electrode is connected to the first connection electrode and the conductive pattern through the second bridge layer.

22. The display device of claim 15, further comprising a bank partitioning an emission area of a sub-pixel of the display device and a sub-region of the sub-pixel that is spaced from the emission area in the one direction, wherein the plurality of light emitting elements are located at the emission area, wherein the first electrode contact hole and the first contact portion are in the sub-region.

* * * * *